(12) United States Patent
Kadota et al.

(10) Patent No.: US 7,956,512 B2
(45) Date of Patent: Jun. 7, 2011

(54) SURFACE ACOUSTIC WAVE DEVICE INCLUDING AN IDT FORMED BY A METAL FILLED IN GROOVES ON A PIEZOELECTRIC SUBSTRATE

(75) Inventors: Michio Kadota, Kyoto (JP); Tetsuya Kimura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/825,520

(22) Filed: Jun. 29, 2010

(65) Prior Publication Data
US 2010/0259129 A1 Oct. 14, 2010

Related U.S. Application Data

(63) Continuation of application No. PCT/JP2008/003883, filed on Dec. 22, 2008.

(30) Foreign Application Priority Data

| Jan. 17, 2008 | (JP) | 2008-008350 |
| Aug. 12, 2008 | (JP) | 2008-207765 |
| Oct. 30, 2008 | (JP) | 2008-279941 |

(51) Int. Cl.
*H01L 41/04* (2006.01)
*H03H 9/25* (2006.01)

(52) U.S. Cl. .................................. 310/313 B
(58) Field of Classification Search .............. 310/313 R, 310/313 A
See application file for complete search history.

(56) References Cited

U.S. PATENT DOCUMENTS

| 4,978,879 A | 12/1990 | Satoh et al. | |
| 7,310,027 B2* | 12/2007 | Kando | 333/133 |
| 7,425,788 B2* | 9/2008 | Kadota et al. | 310/313 B |
| 2007/0120439 A1 | 5/2007 | Kadota et al. | |
| 2009/0189483 A1* | 7/2009 | Kadota et al. | 310/313 B |

FOREIGN PATENT DOCUMENTS

| EP | 1 391 988 A2 | 2/2004 |
| JP | 2-37815 A | 2/1990 |
| JP | 9-83030 A | 3/1997 |
| JP | 52-48375 U | 4/1997 |
| JP | 2004-112748 A | 4/2004 |
| WO | 2006/011417 A1 | 2/2006 |

OTHER PUBLICATIONS

Official Communication issued in International Patent Application No. PCT/JP2008/003883, mailed on Feb. 10, 2009.
Kadota et al.; "Surface Acoustic Wave Device", U.S. Appl. No. 12/825,517, filed Jun. 29, 2010.

* cited by examiner

*Primary Examiner* — J. SanMartin
(74) *Attorney, Agent, or Firm* — Keating & Bennett, LLP

(57) ABSTRACT

A surface acoustic wave device includes a $LiNbO_3$ substrate and is constructed such that the reflection coefficient of an IDT is not only high but the electromechanical coupling coefficient $K^2$ is also high, and the range of Euler angles of the $LiNbO_3$ substrate can be increased to realize a wide range of the electromechanical coupling coefficient $K^2$. A plurality of grooves are provided in an upper surface of the $LiNbO_3$ substrate, an IDT including a plurality of electrode fingers is provided by filling a metal material in the plurality of grooves, and the metal material is Pt or W or an alloy primarily including at least one Pt or W.

3 Claims, 22 Drawing Sheets

SURFACE ACOUSTIC WAVE DEVICE INCLUDING AN IDT FORMED BY A METAL FILLED IN GROOVES ON A PIEZOELECTRIC SUBSTRATE

BACKGROUND OF THE INVENTION

1. Field of the Invention

The present invention relates to a surface acoustic wave device which is used, for example, as a resonator or a band pass filter, and more particularly, to a surface acoustic wave device in which an IDT is formed by using a metal filled in grooves on a piezoelectric substrate.

2. Description of the Related Art

Heretofore, as a resonator and/or a band pass filter, a surface acoustic wave device has been widely used. For example, in WO2006/011417A1, a surface acoustic wave device 1001 having a cross-sectional structure schematically shown in FIG. 26 has been disclosed.

In the surface acoustic wave device 1001, a plurality of grooves 1002b are formed in an upper surface 1002a of an LiTaO₃ substrate 1002. A metal is filled in the plurality of grooves 1002b, and thereby an IDT 1003 including a plurality of electrode fingers made of the above metal is formed. An SiO₂ film 1004 is laminated so as to cover the upper surface 1002a of the LiTaO₃ substrate 1002. Since the LiTaO₃ substrate 1002 has a negative temperature coefficient of frequency TCF, the SiO₂ film 1004 having a positive temperature coefficient of frequency TCF is laminated to the LiTaO₃ substrate 1002, so that the absolute value of the temperature coefficient of frequency TCF of the surface acoustic wave device 1001 can be decreased.

In addition, it is believed that since the IDT is formed by using the metal disposed in the plurality of grooves 1002b, a high reflection coefficient is obtained in the IDT. In particular, when the wavelength of a surface acoustic wave is represented by λ, and the thickness of Al filled in the grooves 1002b, that is, the thickness of the IDT made of Al, is set to 0.04λ, the reflection coefficient per one electrode finger is 0.05, and it has been shown that as the thickness of the electrode is increased, a higher reflection coefficient can be obtained.

In addition, in Japanese Unexamined Patent Application Publication No. 2004-112748, a surface acoustic wave device shown in FIG. 27 is disclosed. In a surface acoustic wave device 1101, an IDT 1103 is provided on a piezoelectric substrate 1102 made of LiTaO₃ or LiNbO₃. In addition, a protective film 1104 is arranged so as to cover the IDT 1103. On the other hand, in a region other than that in which the IDT 1103 and the protective film 1104 are provided, a first insulating layer 1105 made of SiO₂ is provided which has a thickness equal or substantially equal to that of a laminated metal film of the IDT 1103 and the protective film 1104 laminated to each other. In addition, a second insulating layer 1106 made of SiO₂ is laminated so as to cover the first insulating layer 1105. In this case, it has been shown that since a metal having a density greater than that of Al is used for the IDT 1103, the absolute value of the reflection coefficient can be increased, and undesired ripples can be suppressed.

In the surface acoustic wave device 1001 disclosed in WO2006/011417A1, it has been shown that as the thickness of the IDT made of Al is increased, the absolute value of the reflection coefficient can be increased. However, the inventors of the present invention discovered that when the absolute value of the reflection coefficient is simply increased, superior resonant characteristics cannot be obtained. That is, in the surface acoustic wave device disclosed in WO2006/011417A1, although the absolute value of the reflection coefficient can be increased by increasing the thickness of the electrode made of Al, it was found that since the sign of the reflection coefficient is negative, many ripples are generated in a pass band, and thus, superior resonant characteristics cannot be obtained.

In WO2006/011417A1, for the relationship between the thickness of the IDT and the reflection coefficient, only the case in which an IDT made of Al is used on an LiTaO₃ substrate has been described. In addition, in paragraph 0129 of WO2006/011417A1, it has been suggested that the IDT may be formed using another metal, such as Au. However, only an IDT made of Au has been disclosed.

In addition, according to Japanese Unexamined Patent Application Publication No. 2004-112748, it has been disclosed as described above that when the IDT made of a metal having a density higher than that of Al is used, the absolute value of the reflection coefficient can be increased. However, an increase in electromechanical coupling coefficient of a surface acoustic wave device to be obtained has not been particularly described.

In addition, in the structure in which the IDT is formed by filling Au in the grooves provided in the above LiNbO₃ substrate, there has been a problem in that the range of the Euler angles of the LiNbO₃ substrate which can be used to obtain a sufficiently high electromechanical coupling coefficient $K^2$ is very small.

SUMMARY OF THE INVENTION

Preferred embodiments of the present invention provide a surface acoustic wave device which overcomes the problems described above, and in the surface acoustic wave device described above, an LiNbO₃ substrate is used as a piezoelectric substrate, the reflection coefficient of an IDT is not only sufficiently high but the electromechanical coupling coefficient $K^2$ is also high, the range of the Euler angles of an LiNbO₃ substrate which can be used is relatively wide, and the degree of design freedom is increased accordingly.

According to a preferred embodiment of the present invention, a surface acoustic wave device includes a piezoelectric substrate including a plurality of grooves provided in an upper surface thereof and which is made of an LiNbO₃ substrate, and an IDT including a plurality of electrode fingers made of a metal material which is filled in the plurality of grooves in the upper surface of the piezoelectric substrate, and the metal material is Pt or W or an alloy primarily including at least one of Pt or W.

In the surface acoustic wave device according to this preferred embodiment of the present invention, when the wavelength of a surface acoustic wave is represented by λ, an electrode thickness of the IDT and θ of Euler angles (0°±10°, θ, 0°±10° of the LiNbO₃ substrate are made of one of combinations shown in the Table 1 below. In this case, the range of the Euler angle of the LiNbO₃ substrate which obtains a high electromechanical coupling coefficient $K^2$ can be further increased.

TABLE 1

| ELECTRODE MATERIAL | ELECTRODE THICKNESS | EULER ANGLE θ |
|---|---|---|
| Pt | 0.04λ ≦ Pt ≦ 0.08λ | 70° ≦ θ ≦ 134° |
| W | 0.02λ ≦ W ≦ 0.04λ | 70° ≦ θ ≦ 139° |
| W | 0.04λ < W ≦ 0.08λ | 74° ≦ θ ≦ 139° |

In addition, the surface acoustic wave device preferably further includes a dielectric film which is made of $SiO_2$ or an inorganic material primarily including $SiO_2$ and which covers the IDT and the piezoelectric substrate. In this case, since the temperature coefficient of frequency of the dielectric film made of $SiO_2$ or an inorganic material primarily including $SiO_2$ is a positive value and the temperature coefficient of frequency TCF of $LiNbO_3$ is a negative value, a surface acoustic wave device having a small overall absolute value of the temperature coefficient of frequency TCF can be provided.

In a surface acoustic wave device according to another preferred embodiment of the present invention, when the wavelength of a surface acoustic wave is represented by λ, a normalized film thickness of the IDT normalized by λ, a normalized film thickness of an $SiO_2$ film used as the dielectric film normalized by λ, and θ of Euler angles (0°±10°, θ, 0°±10° of the $LiNbO_3$ substrate are one of combinations shown in the Tables 2 to 4 or Tables 5 to 7 below.

TABLE 2

| | RANGE OF EULER ANGLE TO SATISFY $0.2 \geq K^2$ | |
|---|---|---|
| $4 \leq$ FILM THICKNESS OF Pt $\leq 8$ | LOWER LIMIT OF EULER ANGLE θ | UPPER LIMIT OF EULER ANGLE θ |
| $0 \leq$ FILM THICKNESS OF $SiO_2 \leq 5$ | 71 | 131 |
| $5 <$ FILM THICKNESS OF $SiO_2 \leq 10$ | 71 | 121 |
| $10 <$ FILM THICKNESS OF $SiO_2 \leq 15$ | 71 | 117 |
| $15 <$ FILM THICKNESS OF $SiO_2 \leq 20$ | 71 | 117 |
| $20 <$ FILM THICKNESS OF $SiO_2 \leq 25$ | 78 | 120 |
| $25 <$ FILM THICKNESS OF $SiO_2 \leq 30$ | 78 | 120 |
| $30 <$ FILM THICKNESS OF $SiO_2 \leq 35$ | 74 | 116 |

(The film thickness of Pt and the film thickness of $SiO_2$ in the table each indicate the value of the normalized film thickness × $10^2$.)

TABLE 3

| | RANGE OF EULER ANGLE TO SATISFY $0.2 \geq K^2$ | |
|---|---|---|
| $8 <$ FILM THICKNESS OF Pt $\leq 12$ | LOWER LIMIT OF EULER ANGLE θ | UPPER LIMIT OF EULER ANGLE θ |
| $0 \leq$ FILM THICKNESS OF $SiO_2 \leq 5$ | 76 | 131 |
| $5 <$ FILM THICKNESS OF $SiO_2 \leq 10$ | 77 | 121 |
| $10 <$ FILM THICKNESS OF $SiO_2 \leq 15$ | 79 | 117 |
| $15 <$ FILM THICKNESS OF $SiO_2 \leq 20$ | 79 | 117 |
| $20 <$ FILM THICKNESS OF $SiO_2 \leq 25$ | 79 | 123 |
| $25 <$ FILM THICKNESS OF $SiO_2 \leq 30$ | 78 | 128 |
| $30 <$ FILM THICKNESS OF $SiO_2 \leq 35$ | 77 | 116 |

(The film thickness of Pt and the film thickness of $SiO_2$ in the table each indicate the value of the normalized film thickness × $10^2$.)

TABLE 4

| | RANGE OF EULER ANGLE TO SATISFY $0.2 \geq K^2$ | |
|---|---|---|
| $12 <$ FILM THICKNESS OF Pt $\leq 16$ | LOWER LIMIT OF EULER ANGLE θ | UPPER LIMIT OF EULER ANGLE θ |
| $0 \leq$ FILM THICKNESS OF $SiO_2 \leq 5$ | 81 | 125 |
| $5 <$ FILM THICKNESS OF $SiO_2 \leq 10$ | 85 | 121 |
| $10 <$ FILM THICKNESS OF $SiO_2 \leq 15$ | 88 | 119 |
| $15 <$ FILM THICKNESS OF $SiO_2 \leq 20$ | 88 | 119 |
| $20 <$ FILM THICKNESS OF $SiO_2 \leq 25$ | 87 | 121 |
| $25 <$ FILM THICKNESS OF $SiO_2 \leq 30$ | 83 | 126 |
| $30 <$ FILM THICKNESS OF $SiO_2 \leq 35$ | 78 | 132 |

(The film thickness of Pt and the film thickness of $SiO_2$ in the table each indicate the value of the normalized film thickness × $10^2$.)

TABLE 5

| | RANGE OF EULER ANGLE TO SATISFY $0.2 \geq K^2$ | |
|---|---|---|
| $4 \leq$ FILM THICKNESS OF W $\leq 8$ | LOWER LIMIT OF EULER ANGLE θ | UPPER LIMIT OF EULER ANGLE θ |
| $0 \leq$ FILM THICKNESS OF $SiO_2 \leq 5$ | 75 | 133 |
| $5 <$ FILM THICKNESS OF $SiO_2 \leq 10$ | 75 | 131 |
| $10 <$ FILM THICKNESS OF $SiO_2 \leq 15$ | 75 | 124 |
| $15 <$ FILM THICKNESS OF $SiO_2 \leq 20$ | 82 | 123 |
| $20 <$ FILM THICKNESS OF $SiO_2 \leq 25$ | 84 | 120 |
| $25 <$ FILM THICKNESS OF $SiO_2 \leq 30$ | 86 | 116 |
| $30 <$ FILM THICKNESS OF $SiO_2 \leq 35$ | 86 | 116 |

(The film thickness of W and the film thickness of $SiO_2$ in the table each indicate the value of the normalized film thickness × $10^2$.)

TABLE 6

| | RANGE OF EULER ANGLE TO SATISFY $0.2 \geq K^2$ | |
|---|---|---|
| $8 <$ FILM THICKNESS OF W $\leq 12$ | LOWER LIMIT OF EULER ANGLE θ | UPPER LIMIT OF EULER ANGLE θ |
| $0 \leq$ FILM THICKNESS OF $SiO_2 \leq 5$ | 82 | 133 |
| $5 <$ FILM THICKNESS OF $SiO_2 \leq 10$ | 82 | 131 |
| $10 <$ FILM THICKNESS OF $SiO_2 \leq 15$ | 80 | 122 |
| $15 <$ FILM THICKNESS OF $SiO_2 \leq 20$ | 86 | 122 |
| $20 <$ FILM THICKNESS OF $SiO_2 \leq 25$ | 87 | 123 |
| $25 <$ FILM THICKNESS OF $SiO_2 \leq 30$ | 87 | 122 |
| $30 <$ FILM THICKNESS OF $SiO_2 \leq 35$ | 86 | 116 |

(The film thickness of W and the film thickness of $SiO_2 \leq$ in the table each indicate the value of the normalized film thickness × $10^2$.)

TABLE 7

| | RANGE OF EULER ANGLE TO SATISFY $0.2 \geq K^2$ | |
|---|---|---|
| $12 <$ FILM THICKNESS OF W $\leq 16$ | LOWER LIMIT OF EULER ANGLE θ | UPPER LIMIT OF EULER ANGLE θ |
| $0 \leq$ FILM THICKNESS OF $SiO_2 \leq 5$ | 91 | 128 |
| $5 <$ FILM THICKNESS OF $SiO_2 \leq 10$ | 93 | 123 |
| $10 <$ FILM THICKNESS OF $SiO_2 \leq 15$ | 93 | 117 |
| $15 <$ FILM THICKNESS OF $SiO_2 \leq 20$ | 85 | 117 |
| $20 <$ FILM THICKNESS OF $SiO_2 \leq 25$ | 88 | 124 |

TABLE 7-continued

| | RANGE OF EULER ANGLE TO SATISFY $0.2 \geq K^2$ | |
|---|---|---|
| $12 <$ FILM THICKNESS OF W $\leq 16$ | LOWER LIMIT OF EULER ANGLE θ | UPPER LIMIT OF EULER ANGLE θ |
| $25 <$ FILM THICKNESS OF $SiO_2 \leq 30$ | 88 | 126 |
| $30 <$ FILM THICKNESS OF $SiO_2 \leq 35$ | 82 | 128 |

(The film thickness of W and the film thickness of $SiO_2$ in the table each indicate the value of the normalized film thickness $\times 10^2$.)

As described above, when one of combinations shown in the above Tables 2 to 7 is used in accordance with the type of metal material forming the IDT, the range of an Euler angle which achieves a high electromechanical coupling coefficient $K^2$ can be further increased.

According to various preferred embodiments of the present invention, in an IDT having a plurality of electrode fingers made of a metal material which is filled in grooves in an upper surface of a $LiNbO_3$ substrate, since the metal material is Pt or W or an alloy primarily including at least one of PT or W, the reflection coefficient of the IDT is not only high but a high electromechanical coupling coefficient $K^2$ can also be obtained. Furthermore, in order to provide a range of the high electromechanical coupling coefficient $K^2$, the Euler angle of the $LiNbO_3$ substrate can be selected from a wide range. Thus, characteristics of the surface acoustic wave device are improved, and furthermore, the degree of design freedom thereof is also increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the drawings, particular preferred embodiments of the present invention will be described to provide a clear understanding of the present invention.

Figure 1A:
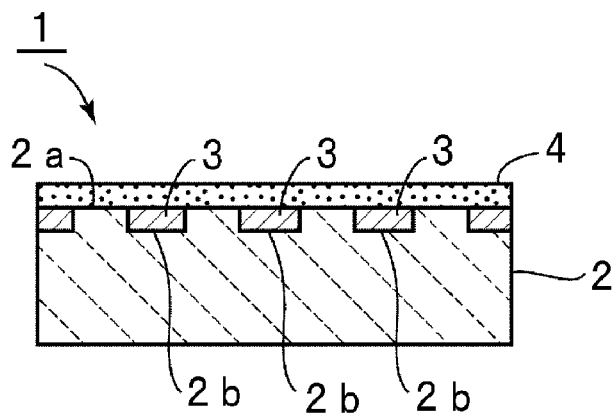
FIG. 1A is a partially schematic front cross-sectional view showing portions of a surface acoustic wave device according to a preferred embodiment of the present invention and FIG. 1B is a schematic plan view of the surface acoustic wave device.
Figure 1B:
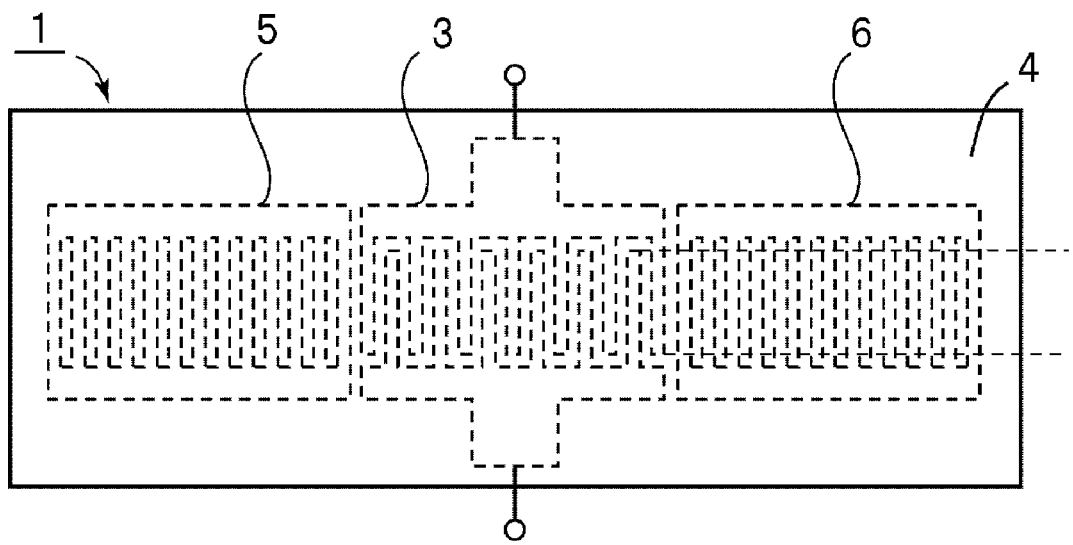

FIG. 1A is a partially schematic front cross-sectional view showing a portion at which an IDT of a surface acoustic wave device according to a first preferred embodiment of the present invention is provided, and FIG. 1B is a schematic plan view of the surface acoustic wave device.

As shown in FIG. 1A, a surface acoustic wave device 1 includes an $LiNbO_3$ substrate 2. A plurality of grooves 2b are provided in an upper surface 2a of the $LiNbO_3$ substrate 2. A metal is filled in the plurality of grooves 2b, so that an IDT 3 including a plurality of electrode fingers is provided. An upper surface of this IDT 3 and the upper surface 2a of the $LiNbO_3$ substrate 2 are flush or approximately flush with each other.

An $SiO_2$ film 4 is preferably arranged so as to cover the upper surface 2a and the IDT 3. However, in preferred embodiments of the present invention, the $SiO_2$ film 4 may not be provided.

As shown in FIG. 1B, the surface acoustic wave device 1 preferably is a one-port type surface acoustic wave resonator which includes the IDT 3 and first and second reflectors 5 and 6 disposed at both sides of the IDT 3 in a surface acoustic wave propagation direction. In addition, the reflectors 5 and 6 are grating reflectors in which both ends of electrode fingers are short-circuited to each other.

As in the IDT 3, the above reflectors 5 and 6 are formed by filling the same metal as that described above in grooves provided in the upper surface 2a of the $LiNbO_3$ substrate 2.

Accordingly, the reflectors 5 and 6 are also flush or approximately flush with the electrode surface and the upper surface 2a of the LiNbO$_3$ substrate 2. Thus, the upper surface of the SiO$_2$ film 4 is approximately planarized over the entire surface acoustic wave device 1.

Although the temperature coefficient of frequency TCF of the LiNbO$_3$ substrate 2 is a negative value, since the temperature coefficient of frequency TCF of the SiO$_2$ film 4 is a positive value, the absolute overall value of the temperature coefficient of frequency TCF is decreased. Thus, in the surface acoustic wave device 1, the change in frequency characteristics caused by the change in temperature is small.

The surface acoustic wave device 1 of this preferred embodiment preferably is a surface acoustic wave device which utilizes an SH wave, and the feature of this device is that the metal material for the IDT 3 is preferably Pt or W or an alloy primarily including at least one of Pt or W, for example. A metal layer made of another metal material, such as an adhesion layer or a diffusion prevention layer, for example, may also be added to the IDT 3, or the IDT 3 may have a laminated structure including another metal layer.

Accordingly, in the surface acoustic wave device 1 of this preferred embodiment, the absolute value of the reflection coefficient of the IDT 3 is not only increased but a high electromechanical coupling coefficient K$^2$ can also be obtained. In addition, as shown in the following experimental examples, when a surface acoustic wave device 1 having a high electromechanical coupling coefficient K$^2$ is obtained, the range of the Euler angles of an LiNbO$_3$ substrate which can be used can be increased. Thus, the degree of design freedom can be increased. This will be described with reference to FIGS. 2 to 9.

Figure 6:
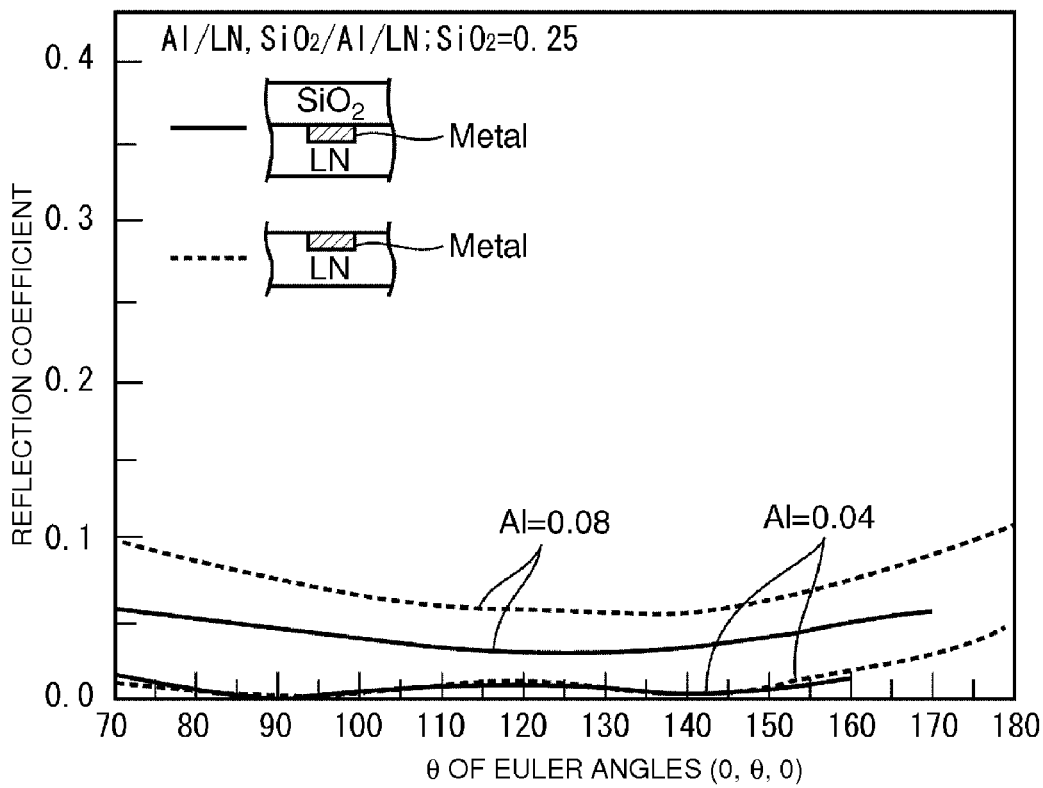
FIG. 6 is a view showing the relationship between the reflection coefficient and the Euler angle θ according to a related example which is obtained when Al is used as a metal material for an IDT, in which a solid line indicates results of a structure in which an $SiO_2$ film is laminated and a dotted line indicates results of a structure in which no $SiO_2$ film is laminated.
Figure 7:
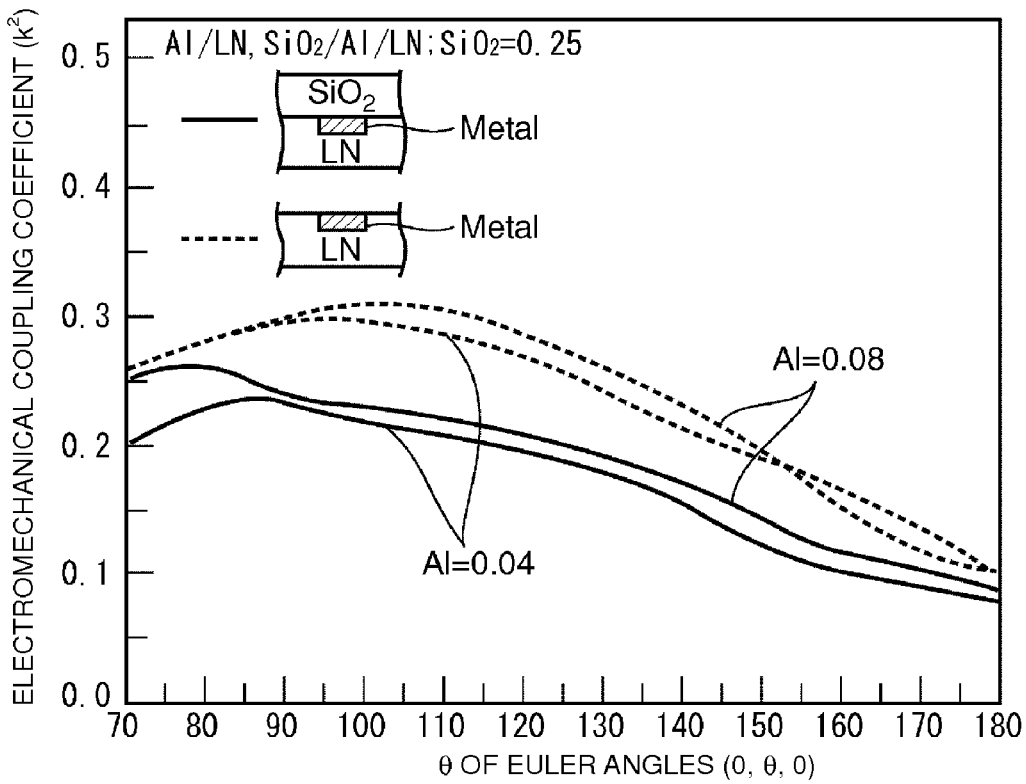
FIG. 7 is a view showing the relationship between the electromechanical coupling coefficient $K^2$ and the Euler angle θ according to a related example which is obtained when Al is used as a metal material for an IDT, in which a solid line indicates results of a structure in which an $SiO_2$ film is laminated and a dotted line indicates results of a structure in which no $SiO_2$ film is laminated.

FIGS. 6 and 7 are views showing the relationship of 8 of Euler angles (0°, θ, 0°) of an LiNbO$_3$ substrate with the reflection coefficient or the electromechanical coupling coefficient K$^2$ of a surface acoustic wave device in which although the structure thereof is similar to that of the surface acoustic wave device 1 of the present preferred embodiment, an IDT electrode and reflectors are made of Al, and a leakage surface acoustic wave is utilized.

In FIGS. 6 and 7, results are shown of the case in which a normalized film thickness of the IDT 3 made of Al normalized by a wavelength λ of a surface acoustic wave is set to about 0.04 or about 0.08. In addition, the results of a structure in which an SiO$_2$ film 4 having a normalized film thickness of about 0.25 is provided are shown by a solid line, and the results of a structure in which no SiO$_2$ film 4 is provided are shown by a dotted line.

As shown in FIG. 6, it was discovered that when Al is used as an electrode material, the reflection coefficient is not significantly increased.

In addition, as shown in FIG. 7, it was discovered that when the Euler angle θ is changed, the electromechanical coupling coefficient K$^2$ can be about 0.2 or greater. However, as shown in FIGS. 6A and 6B, when no SiO$_2$ film 4 is provided, it was discovered that regardless of the value of the Euler angle θ and the film thickness of the IDT made of Al, the reflection coefficient is low, such as about 0.1 or less.

Figure 8:
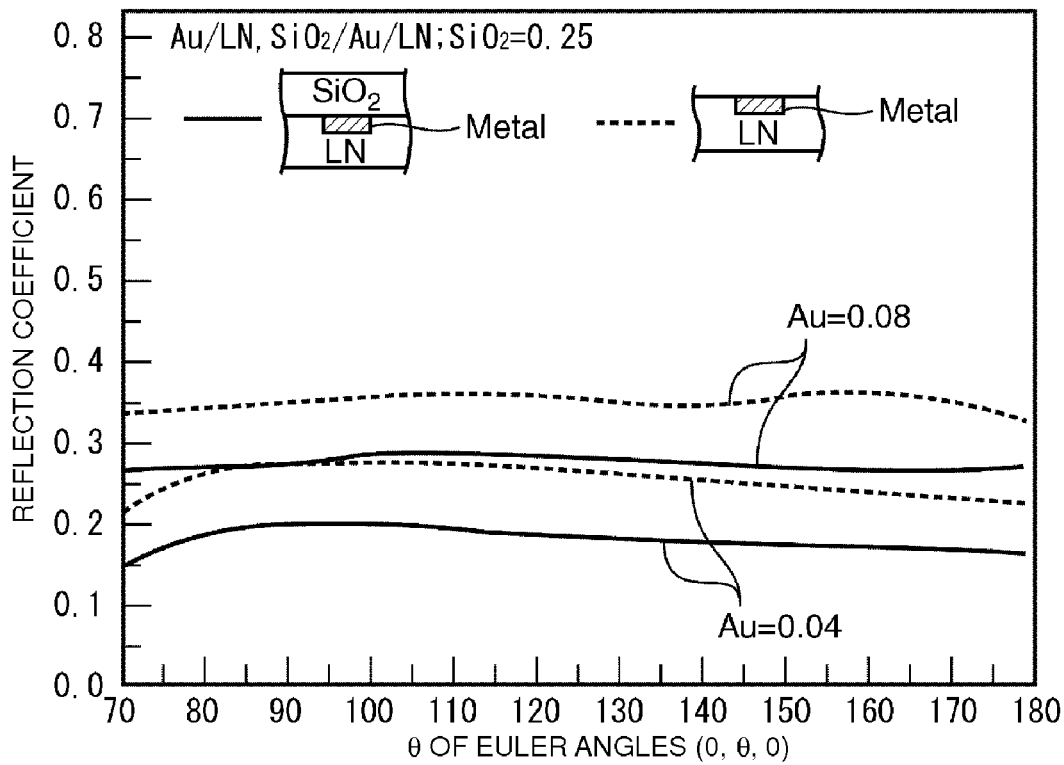
FIG. 8 is a view showing the relationship between the reflection coefficient and the Euler angle θ according to a related example which is obtained when Au is used as a metal material for an IDT, in which a solid line indicates results of a structure in which an $SiO_2$ film is laminated and a dotted line indicates results of a structure in which no $SiO_2$ film is laminated.
Figure 9:
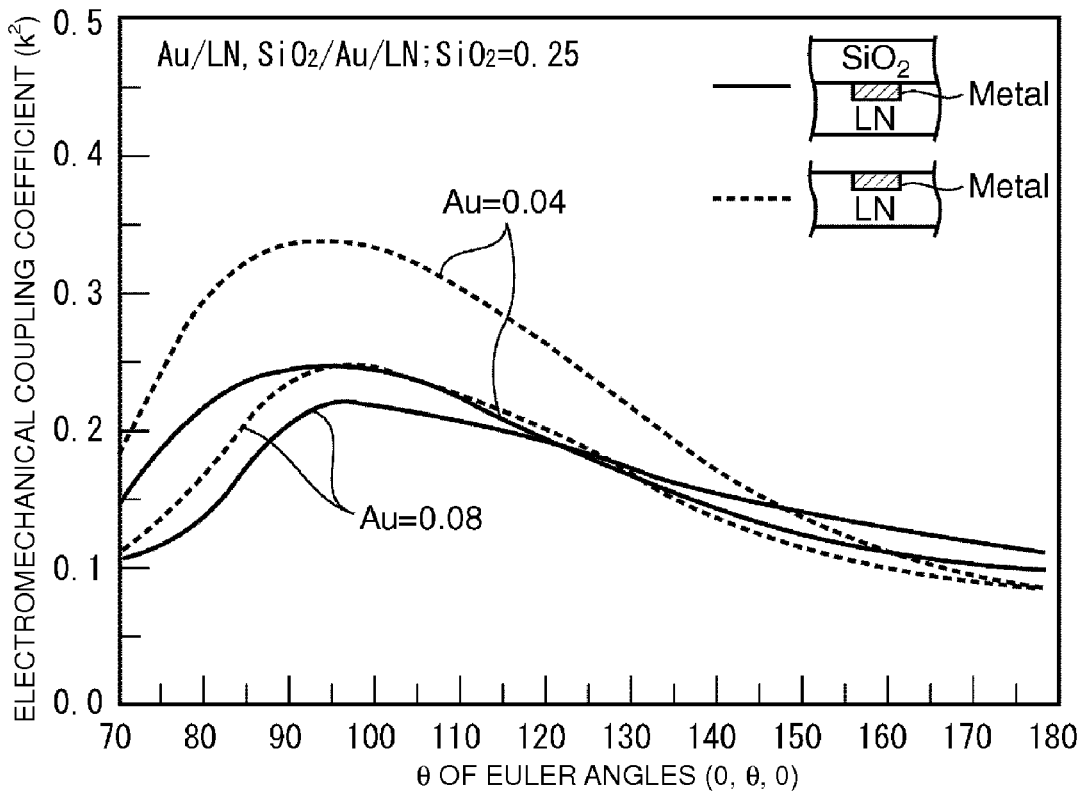
FIG. 9 is a view showing the relationship between the electromechanical coupling coefficient $K^2$ and the Euler angle θ according to a related example which is obtained when Au is used as a metal material for an IDT, in which a solid line indicates results of a structure in which an $SiO_2$ film is laminated and a dotted line indicates results of a structure in which no $SiO_2$ film is laminated.

On the other hand, in FIGS. 8 and 9, the results are shown of the case in which Au having a normalized film thickness of about 0.04 or about 0.08 is used as the electrode material, the normalized film thickness being normalized by a wavelength λ of a surface acoustic wave. That is, the results are shown which are obtained when the IDT electrode 3 and the reflectors 5 and 6 shown in FIG. 1 are made of Au. FIG. 8 shows the relationship between the Euler angle θ and the reflection coefficient, and FIG. 9 shows the relationship between the Euler angle θ and the electromechanical coupling coefficient K$^2$.

In addition, also in FIGS. 8 and 9, the results are shown by a solid line which are obtained when an SiO$_2$ film 4 having a normalized film thickness of about 0.25 is provided, and the results are shown by a dotted line which are obtained when no SiO$_2$ film 4 is provided.

As shown in FIG. 8, it was discovered that as compared to the case in which Al is used as the electrode material shown in FIGS. 6A and 6B, when Au is used as the electrode material, the reflection coefficient can be increased regardless of the Euler angle θ.

However, as shown in FIG. 9, in the structure in which no SiO$_2$ film 4 is provided, a region having a high electromechanical coupling coefficient K$^2$, that is, a region in which the electromechanical coupling coefficient K$^2$ is about 0.2 or greater, is in the range of about 72° to about 131° when the film thickness of the electrode composed of Au is about 0.04λ, and when the film thickness of the electrode made of Au is about 0.08λ, the above region is in the range of about 85° to about 119°. Thus, when the electrode thickness is changed in the range of about 0.04λ to about 0.08λ, it was discovered that when the Euler angle θ is not selected in the range of about 85° to about 119°, the electromechanical coupling coefficient K$^2$ is not about 0.2 or greater.

In the structure in which the IDT 3 and the reflectors 5 and 6 are made of Au and in which the SiO$_2$ film 4 is further provided, it was discovered that in order to obtain an electromechanical coupling coefficient K$^2$ of about 0.2 or greater, the Euler angle θ must be set in the range of about 77° to about 117° when the film thickness of the Au film is about 0.04λ, and that when the film thickness thereof is about 0.08λ, the Euler angle θ must be set in the range of about 90° to about 114°. Thus, it was discovered that when the film thickness of the Au film is in the range of about 0.04λ to about 0.08λ, the Euler angle θ must be set in the range of about 90° to about 114°.

On the other hand, as described below, when Pt or W or an alloy primarily composed of at least one of Pt or W is used as the metal material for the IDT 3, the range of an Euler angle θ at which an electromechanical coupling coefficient K$^2$ of about 0.2 or greater can be obtained is significantly increased. Thus, the degree of design freedom of the surface acoustic wave device can be increased.

In addition, the reason that superior characteristics can be obtained when the electromechanical coupling coefficient K$^2$ is about 0.2 or greater is that in a surface acoustic wave device used as a resonator or a band pass filter, in order to obtain a bandwidth which is required, the electromechanical coupling coefficient K$^2$ is preferably approximately 0.2 or greater.

Figure 2:
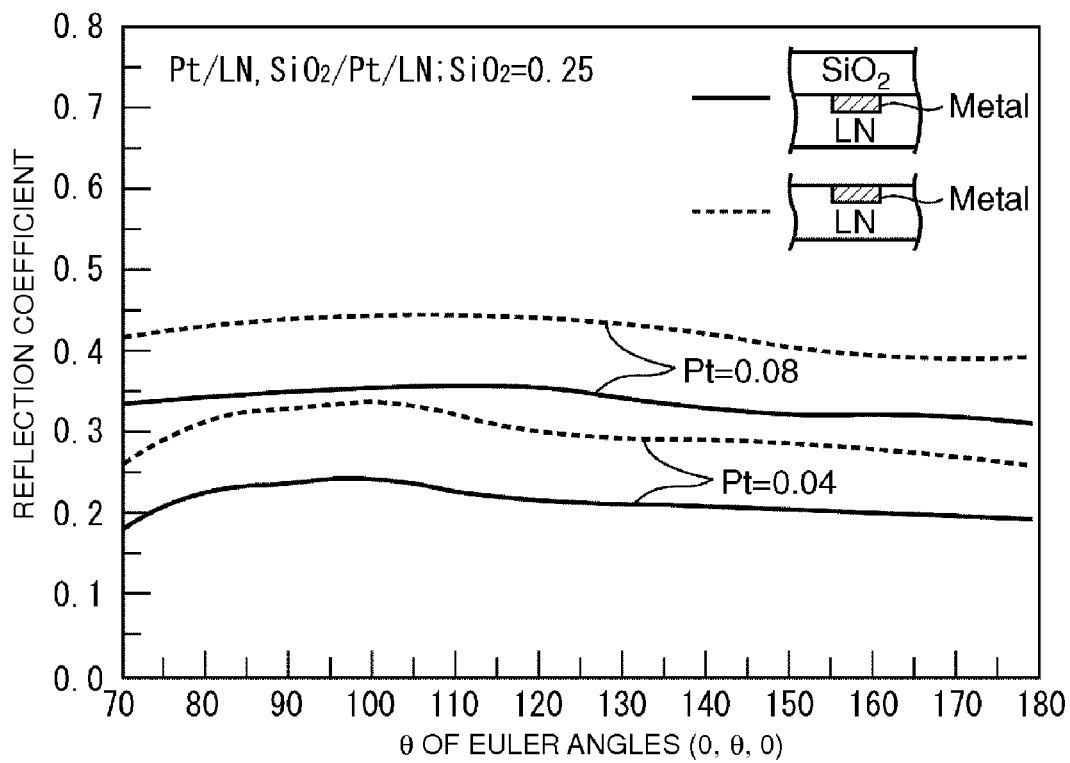
FIG. 2 is a view showing the relationship between the reflection coefficient and the Euler angle θ according to a preferred embodiment of the present invention which is obtained when Pt is used as a metal material for an IDT, in which a solid line indicates results of a structure in which an $SiO_2$ film is laminated and a dotted line indicates results of a structure in which no $SiO_2$ film is laminated.
Figure 3:
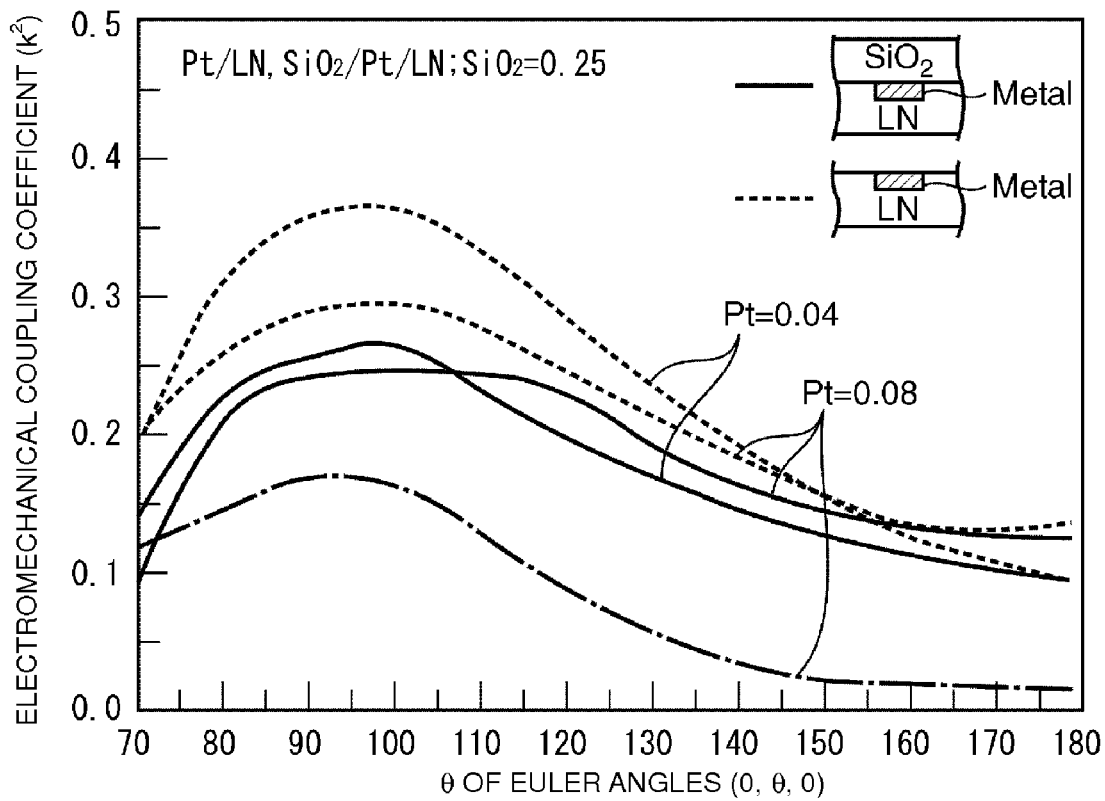
FIG. 3 is a view showing the relationship between the electromechanical coupling coefficient $K^2$ and the Euler angle θ according to a preferred embodiment of the present invention which is obtained when Pt is used as a metal material for an IDT, in which a solid line indicates results of a structure in which an $SiO_2$ film is laminated and a dotted line indicates results of a structure in which no $SiO_2$ film is laminated.

FIGS. 2 and 3 are views showing the relationship of the Euler angle θ of an LiNbO$_3$ substrate with the reflection coefficient or the electromechanical coupling coefficient K$^2$ when Pt is used as the metal material forming the IDT electrode 3 and the reflectors 5 and 6. In FIGS. 2 and 3, the normalized film thickness of the electrode made of Pt normalized by a wavelength λ of a surface acoustic wave is set to about 0.04 or about 0.08. In addition, as in the cases shown in FIGS. 6 to 9, in accordance with the present preferred embodiment, the results obtained when the SiO$_2$ film 4 is provided are shown by a solid line, and the results obtained when no SiO$_2$ film 4 is provided are shown by a dotted line.

In addition, in FIG. 3, for comparison, the results are also shown by a chain line which are obtained when the IDT 3 and the reflectors 5 and 6 are not provided in grooves in an upper surface of a LiNbO₃ substrate but are provided on the upper surface thereof using Pt having a film thickness of about 0.08λ.

In addition, the normalized film thickness of the SiO₂ film 4 normalized by a wavelength λ of a surface acoustic wave is set to about 0.25. Also in the following FIGS. 4 to 9, when the SiO₂ film 4 is provided, each normalized film thickness thereof is set to about 0.25.

As shown in FIG. 2, when Pt is used as the metal material, it was discovered that compared to the case shown in FIG. 6 in which Al is used as the electrode material, a high reflection coefficient can be obtained when the electrode thickness is set to about 0.04λ or about 0.08λ.

In addition, according to the results of a comparative example shown by the chain line, it was discovered that the electromechanical coupling coefficient $K^2$ is low, such as about 0.2 or less, regardless of the value of the Euler angle θ.

On the other hand, according to the present preferred embodiment, it was discovered that the range of an Euler angle at which the electromechanical coupling coefficient $K^2$ is increased to about 0.2 or greater is increased. That is, when no SiO₂ film 4 is provided, it was discovered that when the electrode thickness of Pt is about 0.04λ, the range of θ at which the electromechanical coupling coefficient $K^2$ is about 0.2 or greater is about 70° to about 135°, and that when the electrode thickness of Pt is about 0.08λ, the above range is about 70° to about 134°. Thus, it was discovered that when the electrode thickness of Pt is in the range of about 0.04λ to about 0.08λ, the Euler angle θ may be set in the range of about 70° to about 134°. Accordingly, compared to the case in which Au is used as the metal material, the range of the Euler angle θ can be significantly increased by using Pt.

In addition, when the SiO₂ film 4 is provided, it was discovered from FIG. 3 that when the electrode thickness of the Pt film is about 0.04λ, a region in which the electromechanical coupling coefficient $K^2$ is about 0.2 or greater is in the range of an Euler angle θ of about 76° to about 120°, and that when the electrode thickness is about 0.08λ, the region is in the range of about 78° to about 128°. Thus, it was discovered that when the electrode thickness is in the range of about 0.04λ to about 0.08λ, the Euler angle θ may be set in the range of about 78° to about 120°.

Accordingly, in the structure in which the SiO₂ film 4 is provided, it was discovered that compared to the case in which the Au film is used, the range of the Euler angle θ can be significantly increased by using the Pt film.

Figure 4:
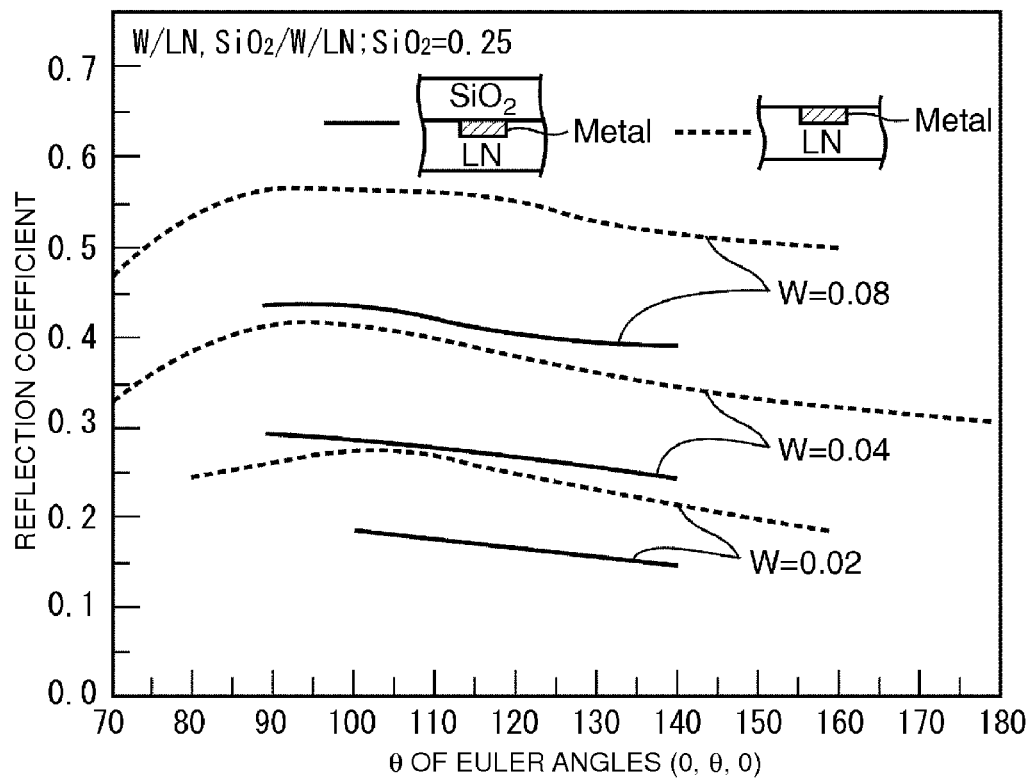
FIG. 4 is a view showing the relationship between the reflection coefficient and the Euler angle θ according to a preferred embodiment of the present invention which is obtained when W is used as a metal material for an IDT, in which a solid line indicates results of a structure in which an $SiO_2$ film is laminated and a dotted line indicates results of a structure in which no $SiO_2$ film is laminated.
Figure 5:
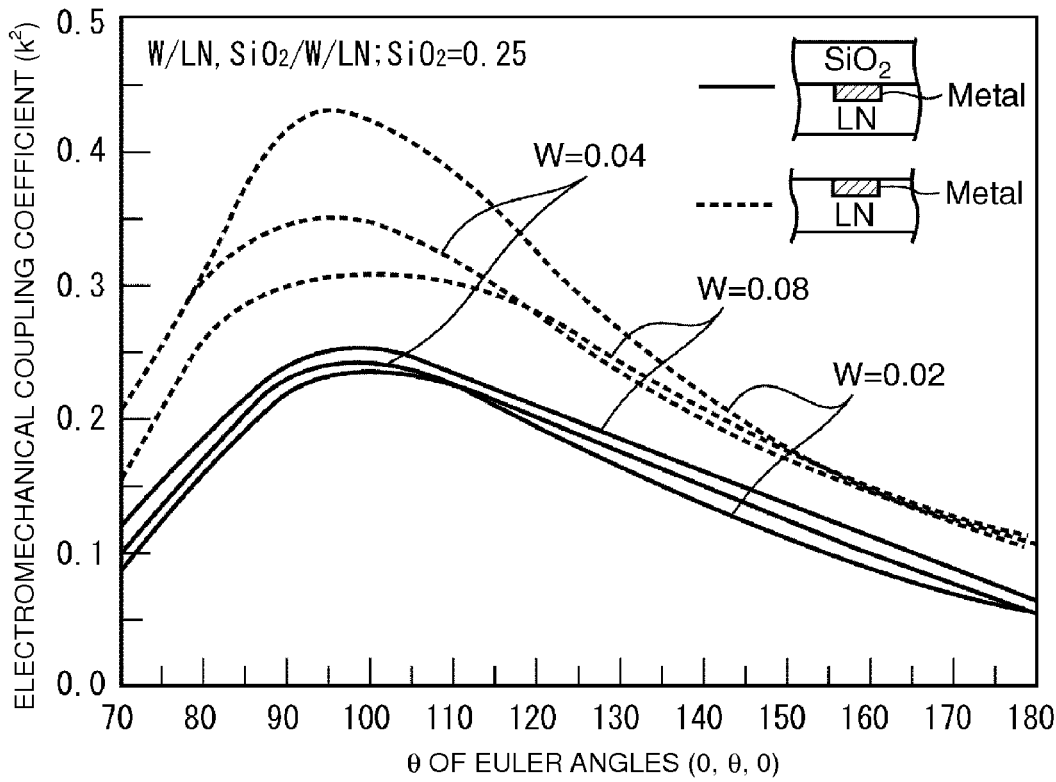
FIG. 5 is a view showing the relationship between the electromechanical coupling coefficient $K^2$ and the Euler angle θ according to a preferred embodiment of the present invention which is obtained when W is used as a metal material for an IDT, in which a solid line indicates results of a structure in which an $SiO_2$ film is laminated and a dotted line indicates results of a structure in which no $SiO_2$ film is laminated.

FIGS. 4 and 5 are views showing the relationship of the Euler angle θ with the reflection coefficient or the electromechanical coupling coefficient $K^2$. In FIGS. 4 and 5, the normalized film thickness of W used as the metal material for the IDT 3 and the reflectors 5 and 6 is set to about 0.02, about 0.04 or about 0.08. Furthermore, in FIGS. 4 and 5, the results obtained when the SiO₂ film 4 is provided are shown by a solid line, and the results obtained when no SiO₂ film 4 is provided are shown by a dotted line.

As shown in FIG. 4, as in the case in which W is used as the metal material, it was discovered that compared to the case in which Al is used, a high reflection coefficient can be obtained regardless of the range of the Euler angle θ.

In addition, as shown in FIG. 5, in the structure in which no SiO₂ film 4 is provided, it was discovered that the range of an Euler angle which can achieve an electromechanical coupling coefficient $K^2$ of about 0.2 or more may be set to about 70° to about 144° when the film thickness of the W film is about 0.02λ, that the range may be set to about 70° to about 139° when the film thickness is about 0.04λ, and that the range may be set to about 74° to about 139° when the film thickness is about 0.08λ. Accordingly, when W is used as the metal material, it was discovered that when the film thickness thereof is in the range of about 0.02λ to about 0.04λ, the Euler angle θ may be set in the range of about 70° to about 139°, and that when the film thickness is in the range of about 0.04λ to about 0.08λ, the Euler angle θ may be set in the range of about 74° to about 139°. Thus, compared to the range of about 85° to about 119° obtained when Au is used, the range of the Euler angle θ can be significantly increased. In the structure in which the SiO₂ film 4 is provided, it was discovered from FIG. 5 that when the electrode thickness of W is about 0.02λ, the range of an Euler angle θ which can increase the electromechanical coupling coefficient $K^2$ to about 0.2 or greater may be set to about 87° to about 119°, that when the electrode thickness is about 0.04λ, the above range may be set to about 84° to about 120°, and that when the electrode thickness is about 0.08λ, the above range may be set to about 82° to about 123°. That is, it was discovered that when the electrode thickness of W is in the range of about 0.02, to about 0.04λ, the Euler angle θ may be set in the range of about 87° to about 119°, and that when the electrode thickness of W is in the range of about 0.04λ to about 0.08λ, the Euler angle θ may be set in the range of about 84° to about 120°. Accordingly, it was discovered that compared to the range of about 90° to about 114° obtained when the Au film is used, the range of the Euler angle θ can be significantly increased.

When the results described with reference to FIGS. 2 to 9 are summarized, a combination among the metal material used for an electrode, the electrode thickness of the above metal material, and the Euler angle θ, which achieves an electromechanical coupling coefficient $K^2$ of about 0.2 or greater, corresponds to one of combinations shown in Table 8 below. Table 8 shows the results of the structure in which no SiO₂ film is laminated.

TABLE 8

| ELECTRODE MATERIAL | ELECTRODE THICKNESS | EULER ANGLE θ |
|---|---|---|
| Pt | 0.04λ ≦ Pt ≦ 0.08λ | 70° ≦ θ ≦ 134° |
| W | 0.02λ ≦ W ≦ 0.04λ | 70° ≦ θ ≦ 139° |
| W | 0.04λ < W ≦ 0.08λ | 74° ≦ θ ≦ 139° |
| Au | 0.04λ ≦ Au ≦ 0.08λ | 85° ≦ θ ≦ 119° |

In Table 8, for comparison, the case in which Au is used as the metal material is also shown.

In Table 8, when no SiO₂ film is provided, the range of the electrode thickness and the range of the Euler angle θ in which the electromechanical coupling coefficient $K^2$ is about 0.2 or greater are shown for each electrode material.

In the structure in which the SiO₂ film is provided as a dielectric film to cover the IDT electrode, the inventors of the present invention also took the normalized film thickness of the SiO₂ film into consideration in addition to the electrode material and the electrode thickness, and the range of an Euler angle θ at which the electromechanical coupling coefficient $K^2$ is about 0.2 or greater was investigated. The results will be described below for each metal material.

FIGS. 10A and 10B to FIGS. 17A and 17B are views showing the relationship of the reflection coefficient with the Euler angle θ and the relationship of the electromechanical coupling coefficient $K^2$ therewith, respectively, each of which is obtained when Pt is used as the metal material and SiO₂ films having various film thicknesses are provided.

Figure 10A:
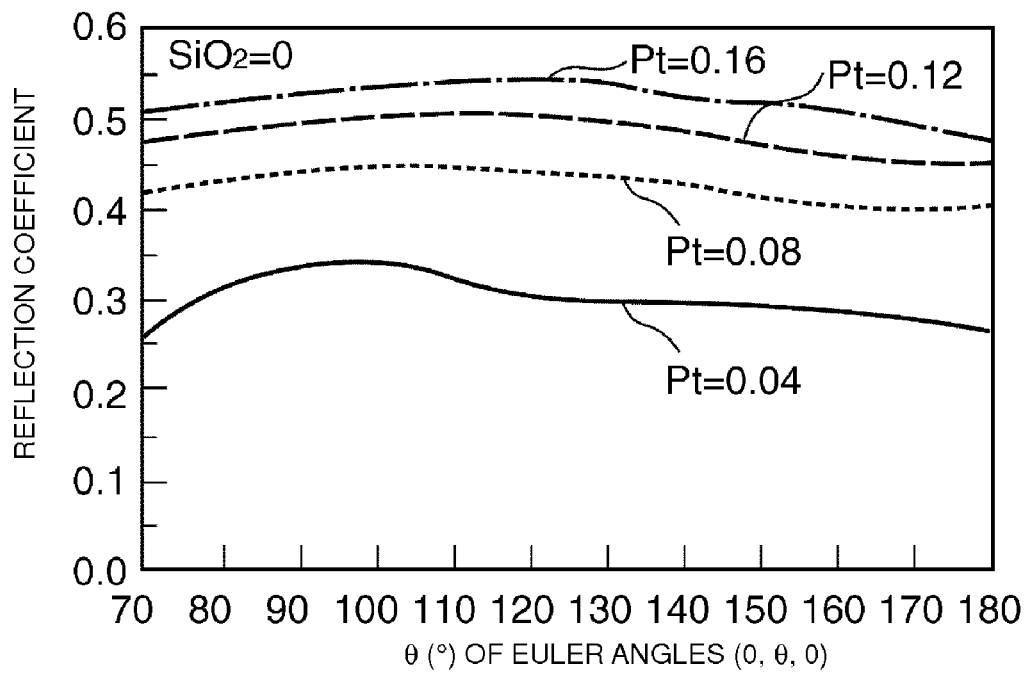
FIGS. 10A and 10B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material form an IDT and no $SiO_2$ film is laminated.
Figure 10B:
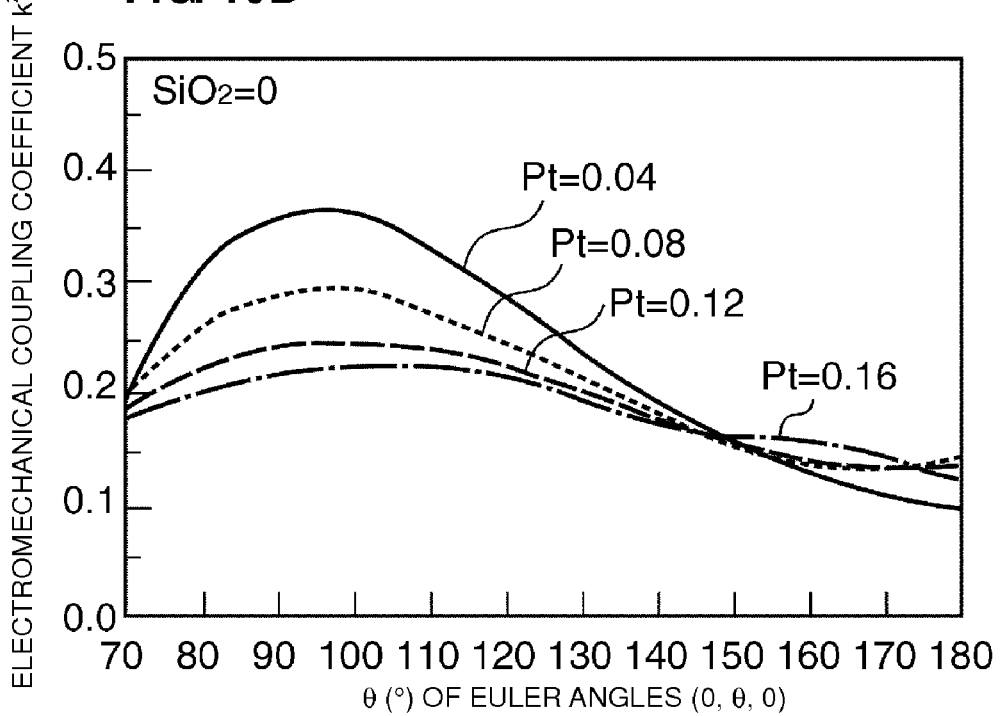
Figure 11A:
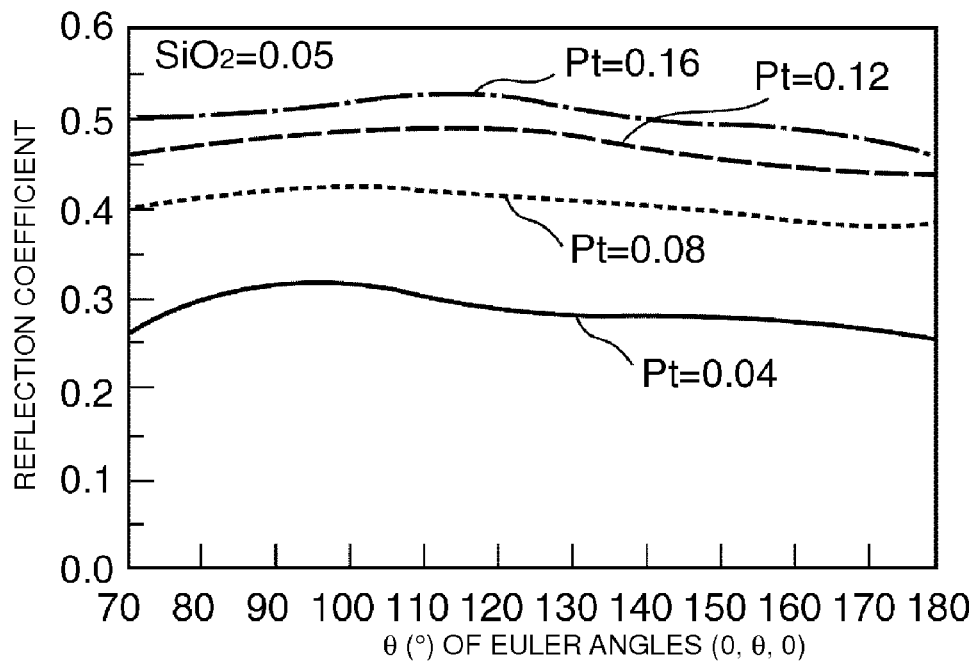
FIGS. 11A and 11B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material form an IDT and a normalized film thickness of an $SiO_2$ film is about 0.05.
Figure 11B:
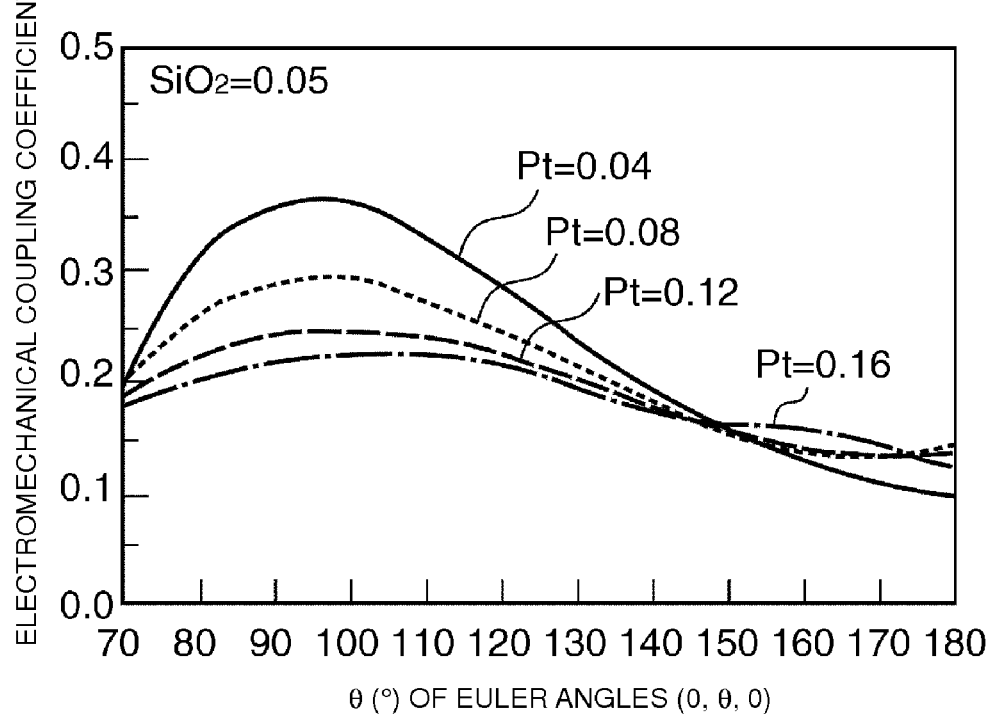
Figure 12A:
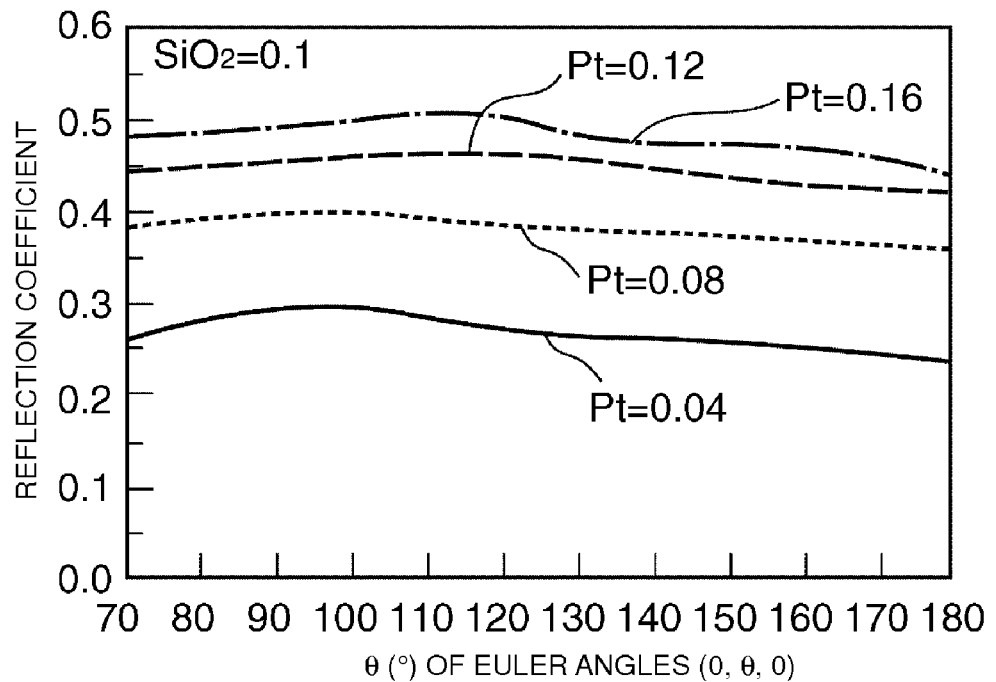
FIGS. 12A and 12B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.1.
Figure 12B:
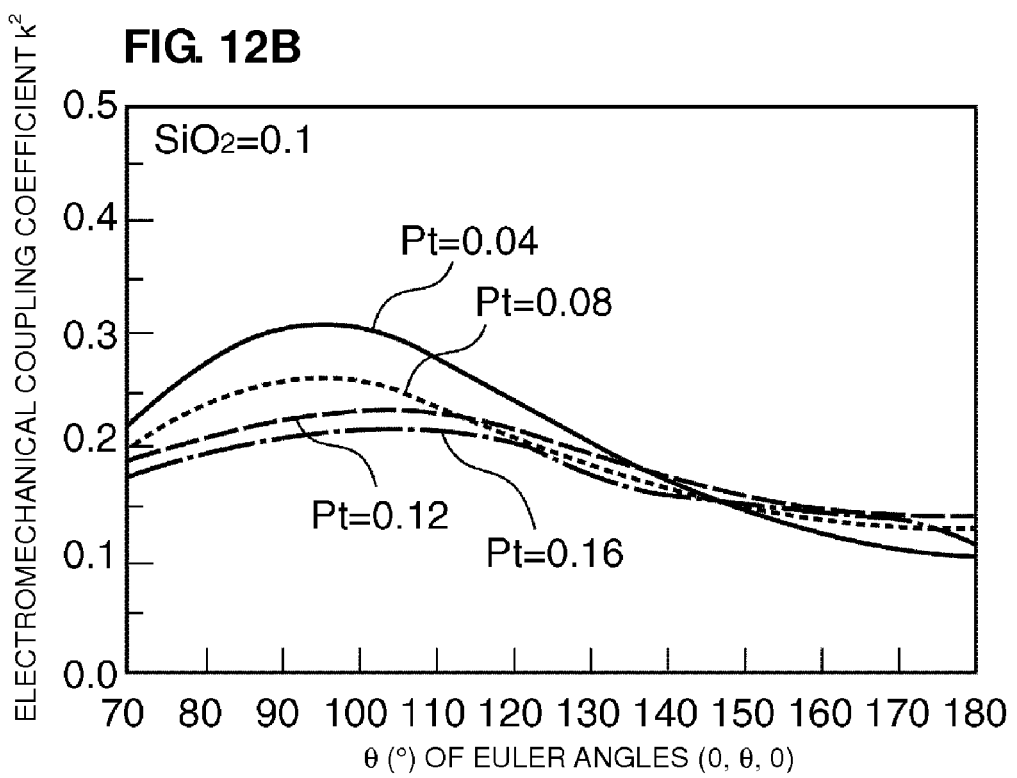
Figure 13A:
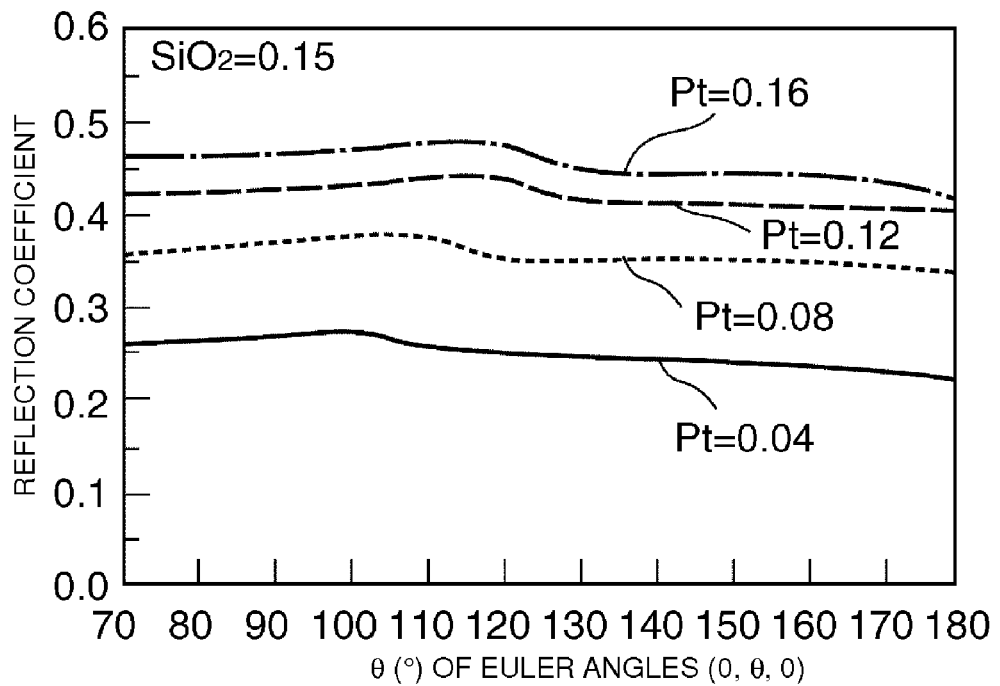
FIGS. 13A and 13B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.15.
Figure 13B:
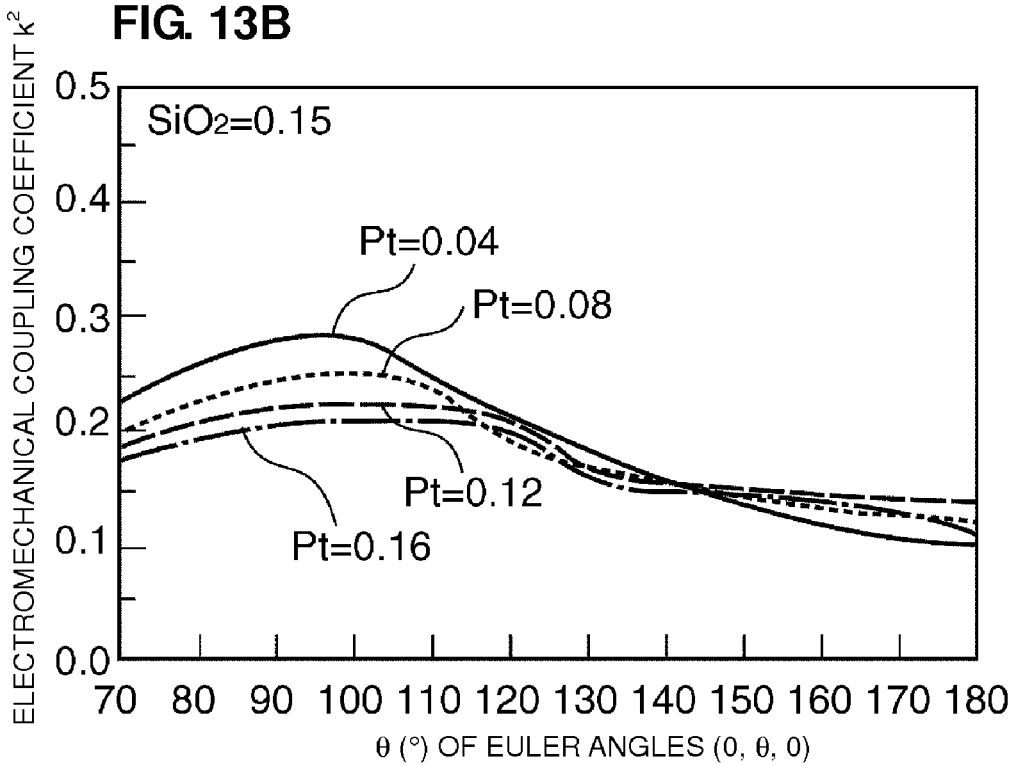
Figure 14A:
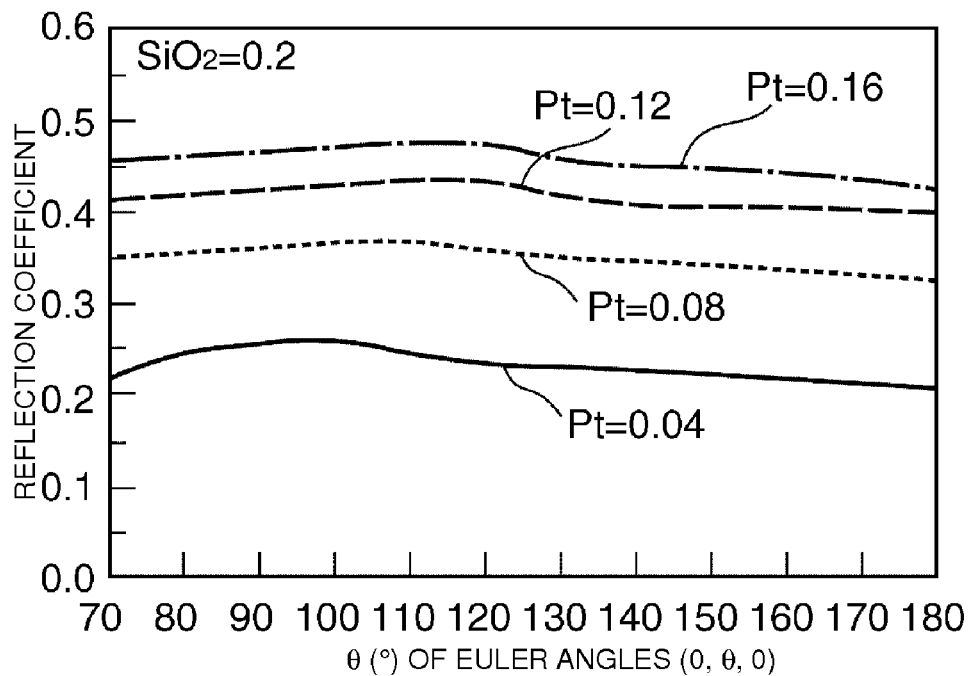
FIGS. 14A and 14B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.2.
Figure 14B:
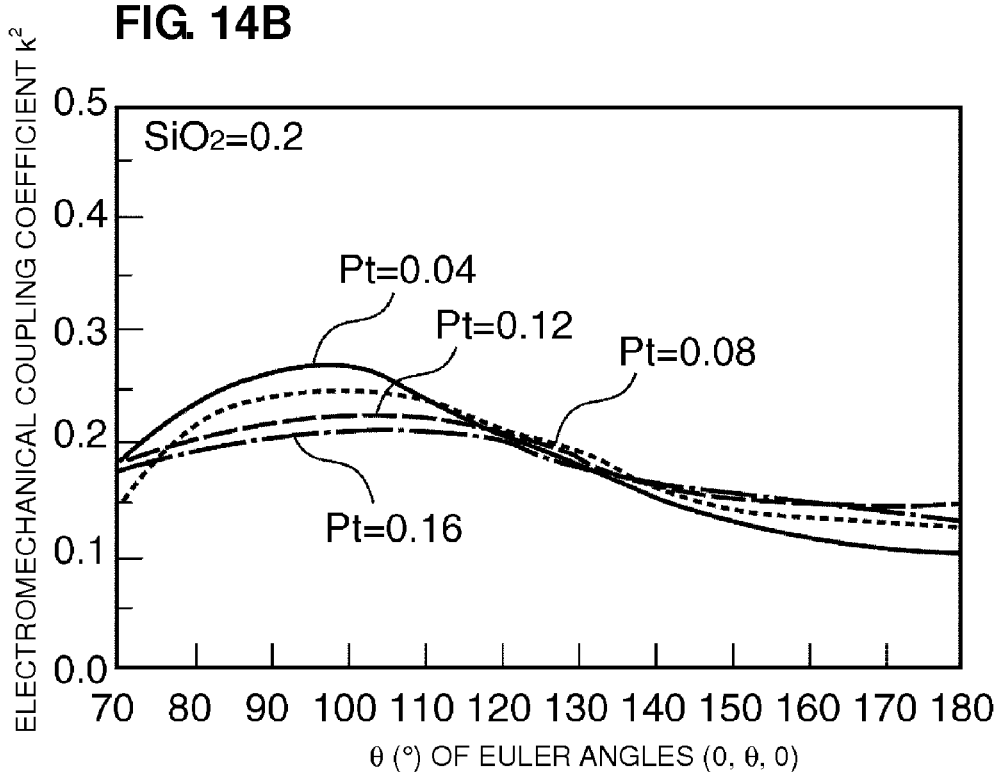
Figure 15A:
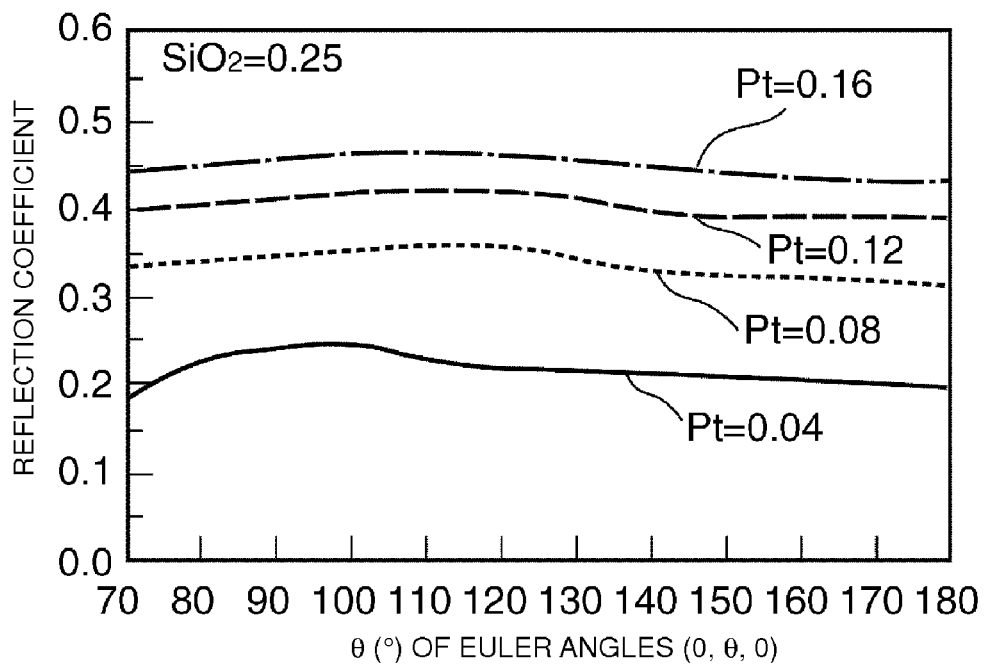
FIGS. 15A and 15B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.25.
Figure 15B:
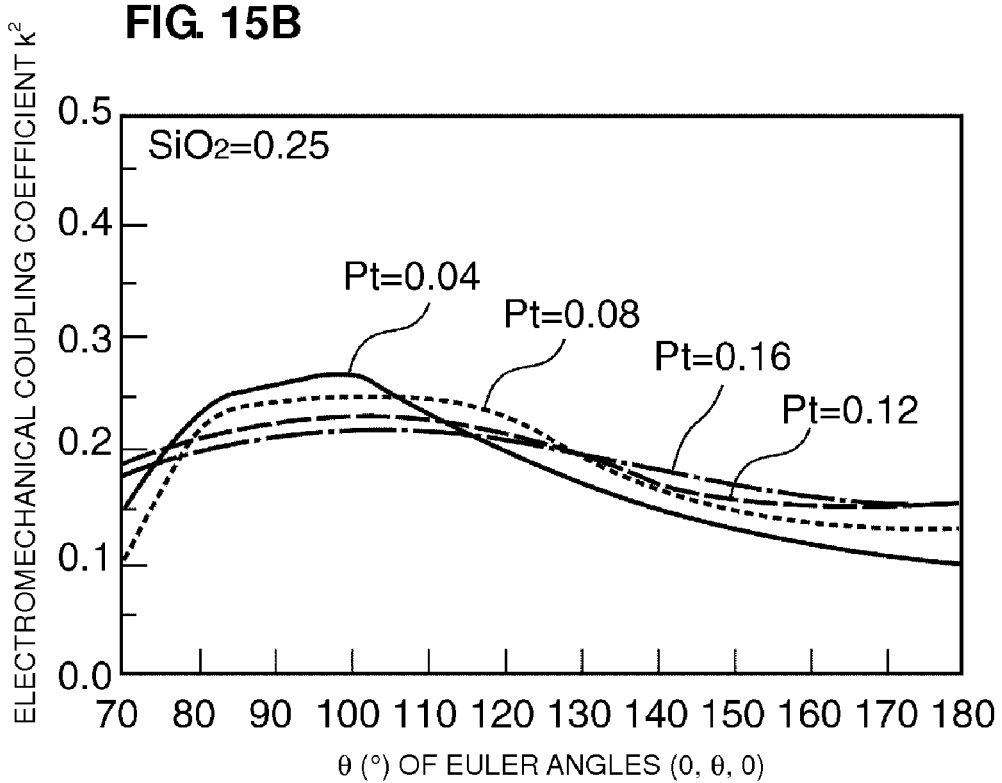
Figure 16A:
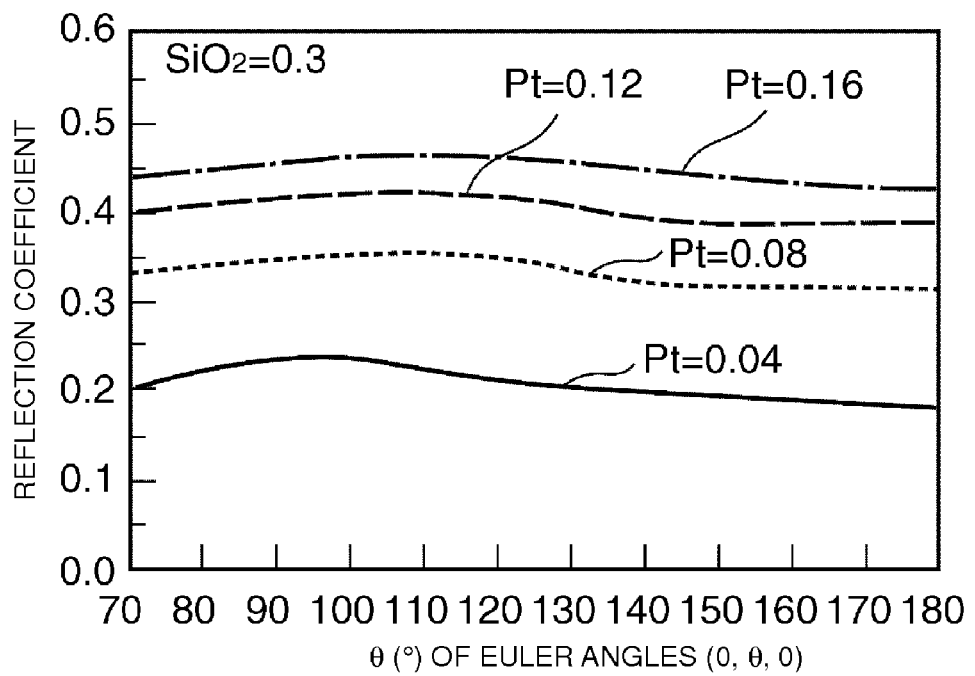
FIGS. 16A and 16B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.3.
Figure 16B:
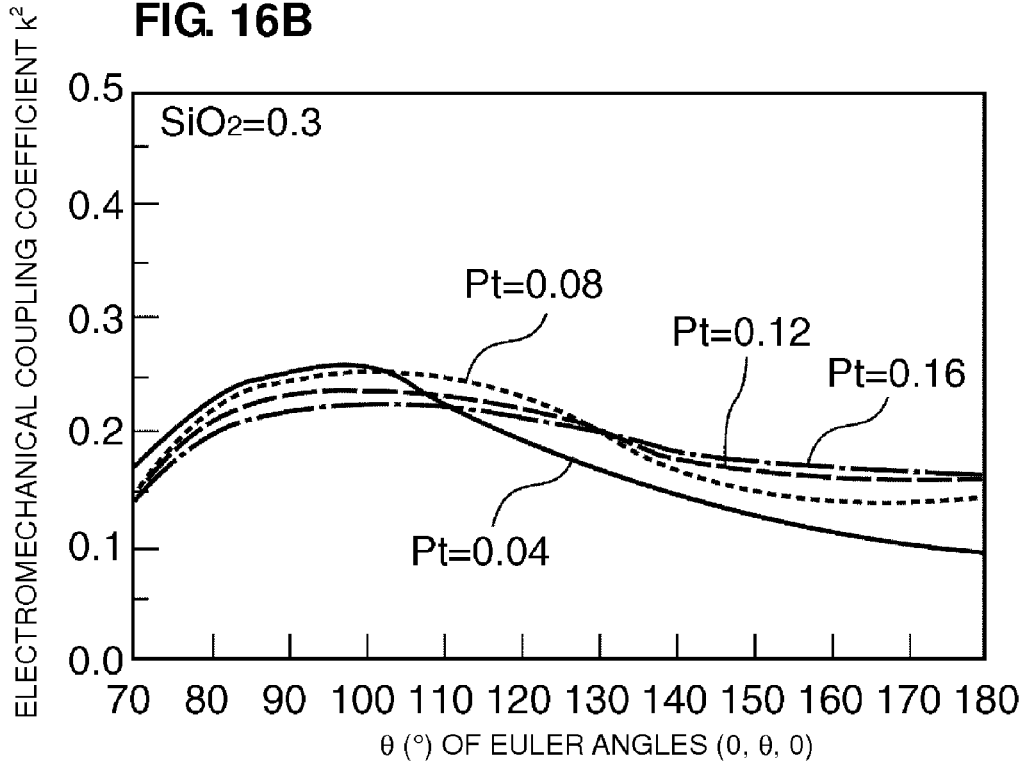
Figure 17A:
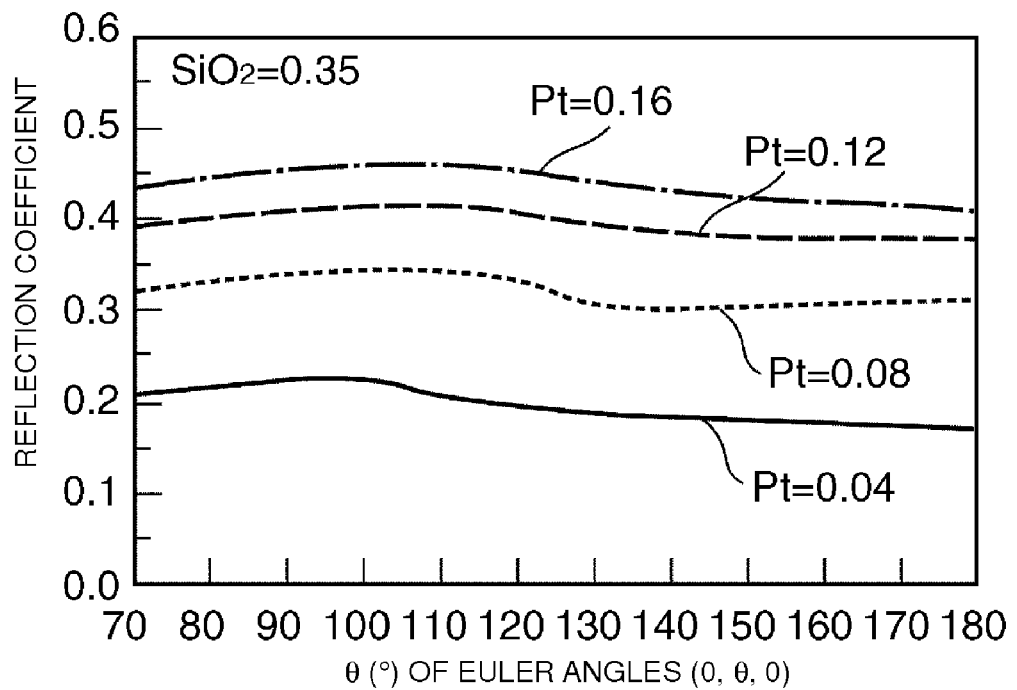
FIGS. 17A and 17B are views showing the relationship of the reflection coefficient with a normalized film thickness of a Pt film and the Euler angle θ and the relationship of the electromechanical coupling coefficient $K^2$ therewith, respectively, according to a preferred embodiment of the present invention, each of which is obtained when Pt is used as a metal material for an IDT and a normalized film thickness of an $SiO_2$ film is about 0.35.
Figure 17B:
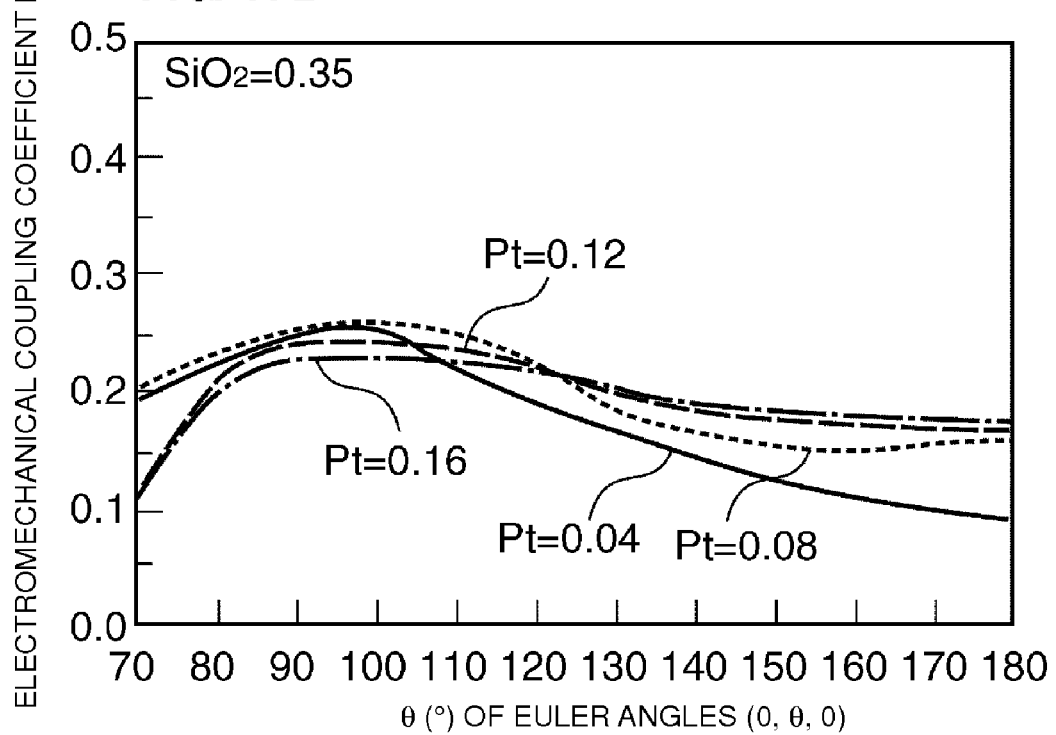

In addition, FIGS. 10A and 10B show the results obtained when the normalized film thickness of the SiO₂ film normalized by λ is 0, that is, when no SiO₂ film is provided, and FIGS. 11A to 17B show the results obtained when the normalized film thickness of the $SiO_2$ film is about 0.05, about 0.1, about 0.15, about 0.2, about 0.25, about 0.3, or about 0.35. In addition, the film of Pt used as the metal material forming the IDT 3 and the reflectors 5 and 6 is formed to have various normalized film thicknesses as shown in FIGS. 10A to 17B. As shown in FIG. 2 described above, when Pt is used as the metal material, compared to the case in which Al is used, a high reflection coefficient can be obtained regardless of the range of the Euler angle θ. In FIG. 10A to FIG. 17A, it was also discovered that even when the film thickness of the Pt film is variously changed, a high reflection coefficient can be obtained regardless of the value of the Euler angle θ.

On the other hand, as apparent from FIG. 10B to FIG. 17B, it discovered that when the normalized film thickness of Pt is in the range of about 0.04 to about 0.08, if the range of the normalized film thickness of the $SiO_2$ film and the range of the Euler angle θ correspond to one of combinations shown in Table 9 below, the electromechanical coupling coefficient $K^2$ can be made about 0.2 or greater. In addition, in Table 9, the lower limit and the upper limit of the range of the Euler angle θ are shown. For example, Table 9 indicates that when the film thickness of the $SiO_2$ film is about 0.05 or less, the Euler angle θ may be set in the range of about 71° to about 131°.

In addition, when the normalized film thickness of the Pt film is in the range of more than about 0.08 to about 0.12, the range of the film thickness of the $SiO_2$ film and the range of the Euler angle θ may be made to correspond to one of combinations shown in Table 10 below, and when the normalized film thickness of the Pt film is in the range of about 0.12 to about 0.16, the range of the film thickness of the $SiO_2$ film and the range of the Euler angle θ may correspond to one of combinations shown in Table 11 below, so that the electromechanical coupling coefficient $K^2$ is about 0.2 or greater as in the case described above. Tables 9 to 11 are based on the results shown in FIGS. 10A to 17B described above.

TABLE 9

| | RANGE OF EULER ANGLE TO SATISFY $0.2 \geq K^2$ | |
|---|---|---|
| $4 \leq$ FILM THICKNESS OF Pt $\leq 8$ | LOWER LIMIT OF EULER ANGLE θ | UPPER LIMIT OF EULER ANGLE θ |
| $0 \leq$ FILM THICKNESS OF $SiO_2 \leq 5$ | 71 | 131 |
| $5 <$ FILM THICKNESS OF $SiO_2 \leq 10$ | 71 | 121 |
| $10 <$ FILM THICKNESS OF $SiO_2 \leq 15$ | 71 | 117 |
| $15 <$ FILM THICKNESS OF $SiO_2 \leq 20$ | 71 | 117 |
| $20 <$ FILM THICKNESS OF $SiO_2 \leq 25$ | 78 | 120 |
| $25 <$ FILM THICKNESS OF $SiO_2 \leq 30$ | 78 | 120 |
| $30 <$ FILM THICKNESS OF $SiO_2 \leq 35$ | 74 | 116 |

(The film thickness of Pt and the film thickness of $SiO_2$ in the table each indicate the value of the normalized film thickness × $10^2$.)

TABLE 10

| | RANGE OF EULER ANGLE TO SATISFY $0.2 \geq K^2$ | |
|---|---|---|
| $8 <$ FILM THICKNESS OF Pt $\leq 12$ | LOWER LIMIT OF EULER ANGLE θ | UPPER LIMIT OF EULER ANGLE θ |
| $0 \leq$ FILM THICKNESS OF $SiO_2 \leq 5$ | 76 | 131 |
| $5 <$ FILM THICKNESS OF $SiO_2 \leq 10$ | 77 | 121 |
| $10 <$ FILM THICKNESS OF $SiO_2 \leq 15$ | 79 | 117 |
| $15 <$ FILM THICKNESS OF $SiO_2 \leq 20$ | 79 | 117 |
| $20 <$ FILM THICKNESS OF $SiO_2 \leq 25$ | 79 | 123 |
| $25 <$ FILM THICKNESS OF $SiO_2 \leq 30$ | 78 | 128 |
| $30 <$ FILM THICKNESS OF $SiO_2 \leq 35$ | 77 | 116 |

(The film thickness of Pt and the film thickness of $SiO_2$ in the table each indicate the value of the normalized film thickness × $10^2$.)

TABLE 11

| | RANGE OF EULER ANGLE TO SATISFY $0.2 \geq K^2$ | |
|---|---|---|
| $12 <$ FILM THICKNESS OF Pt $\leq 16$ | LOWER LIMIT OF EULER ANGLE θ | UPPER LIMIT OF EULER ANGLE θ |
| $0 \leq$ FILM THICKNESS OF $SiO_2 \leq 5$ | 81 | 125 |
| $5 <$ FILM THICKNESS OF $SiO_2 \leq 10$ | 85 | 121 |
| $10 <$ FILM THICKNESS OF $SiO_2 \leq 15$ | 88 | 119 |
| $15 <$ FILM THICKNESS OF $SiO_2 \leq 20$ | 88 | 119 |
| $20 <$ FILM THICKNESS OF $SiO_2 \leq 25$ | 87 | 121 |
| $25 <$ FILM THICKNESS OF $SiO_2 \leq 30$ | 83 | 126 |
| $30 <$ FILM THICKNESS OF $SiO_2 \leq 35$ | 78 | 132 |

(The film thickness of Pt and the film thickness of $SiO_2$ in the table each indicate the value of the normalized film thickness × $10^2$.)

FIGS. 18A and 18B to FIGS. 25A and 25B are views showing the relationship of the reflection coefficient with the Euler angle θ and the relationship of the electromechanical coupling coefficient $K^2$ therewith, respectively, each of which is obtained when W is used as the metal material and $SiO_2$ films having various film thicknesses are provided.

Figure 18A:
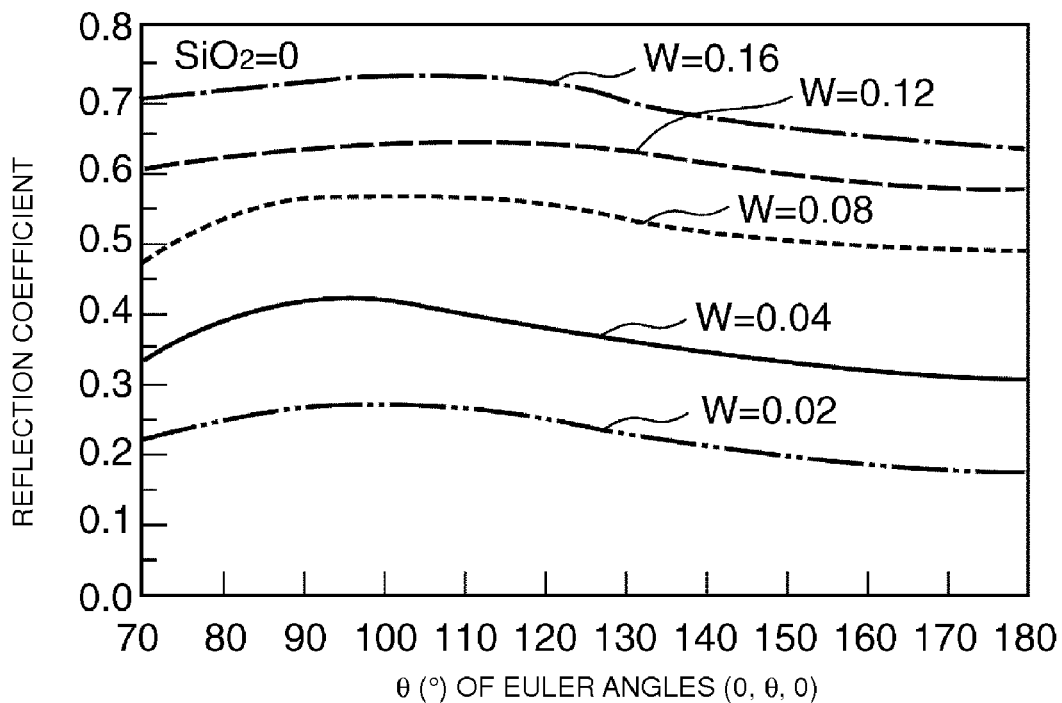
FIGS. 18A and 18B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and no $SiO_2$ film is laminated.
Figure 18B:
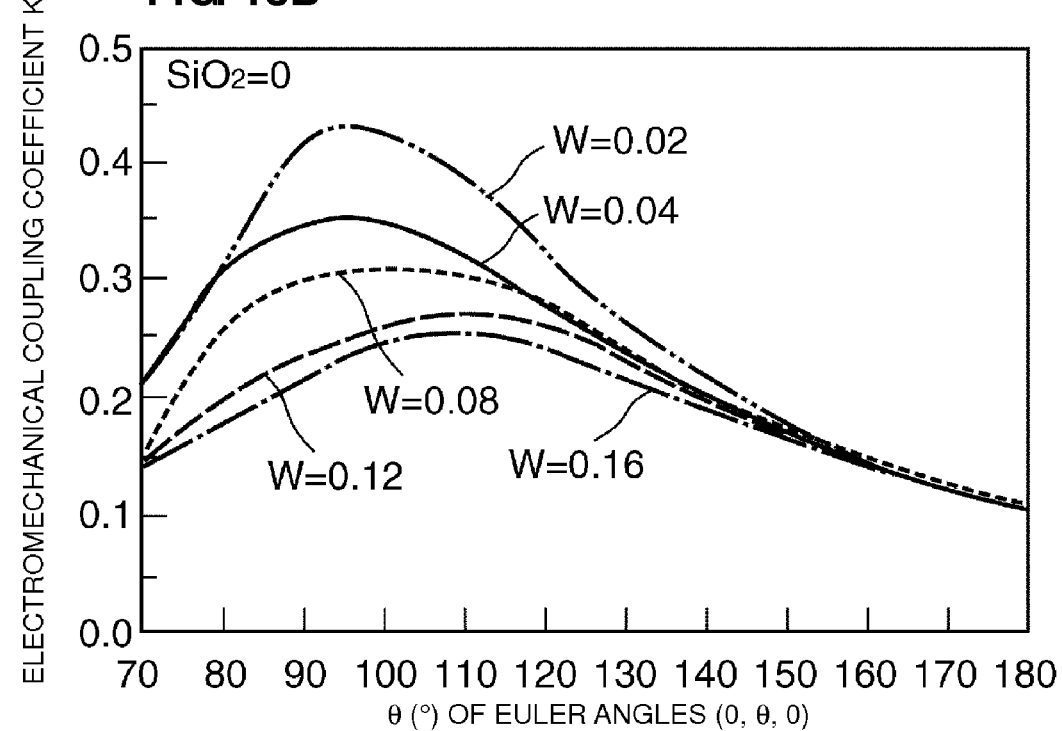
Figure 19A:
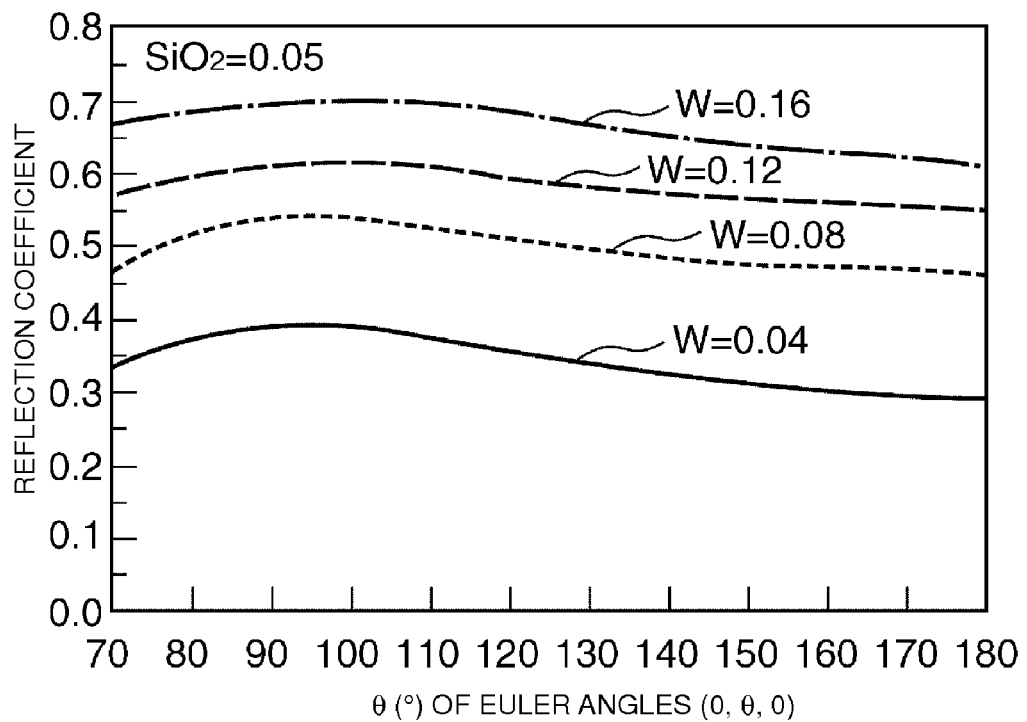
FIGS. 19A and 19B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.05.
Figure 19B:
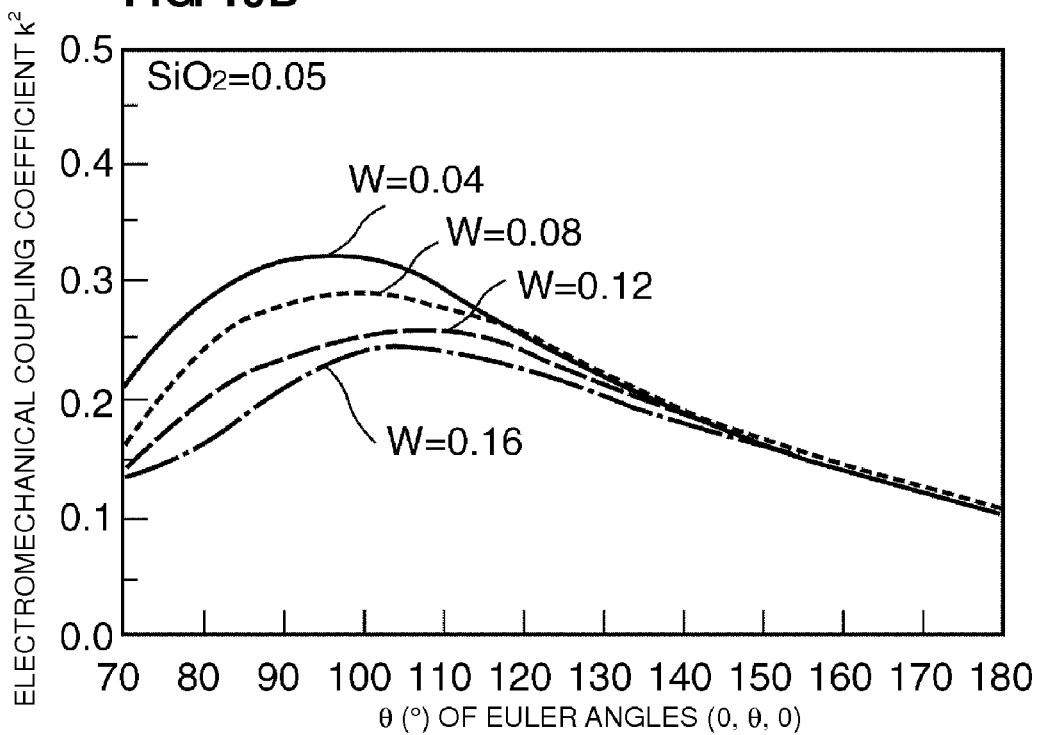
Figure 20A:
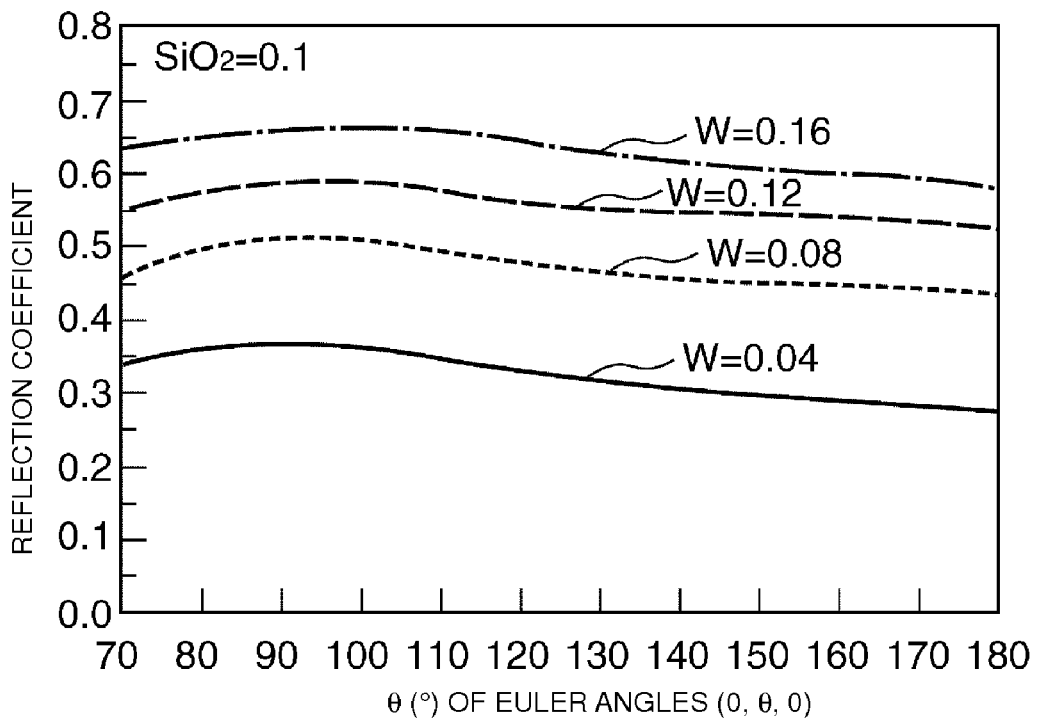
FIGS. 20A and 20B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.1.
Figure 20B:
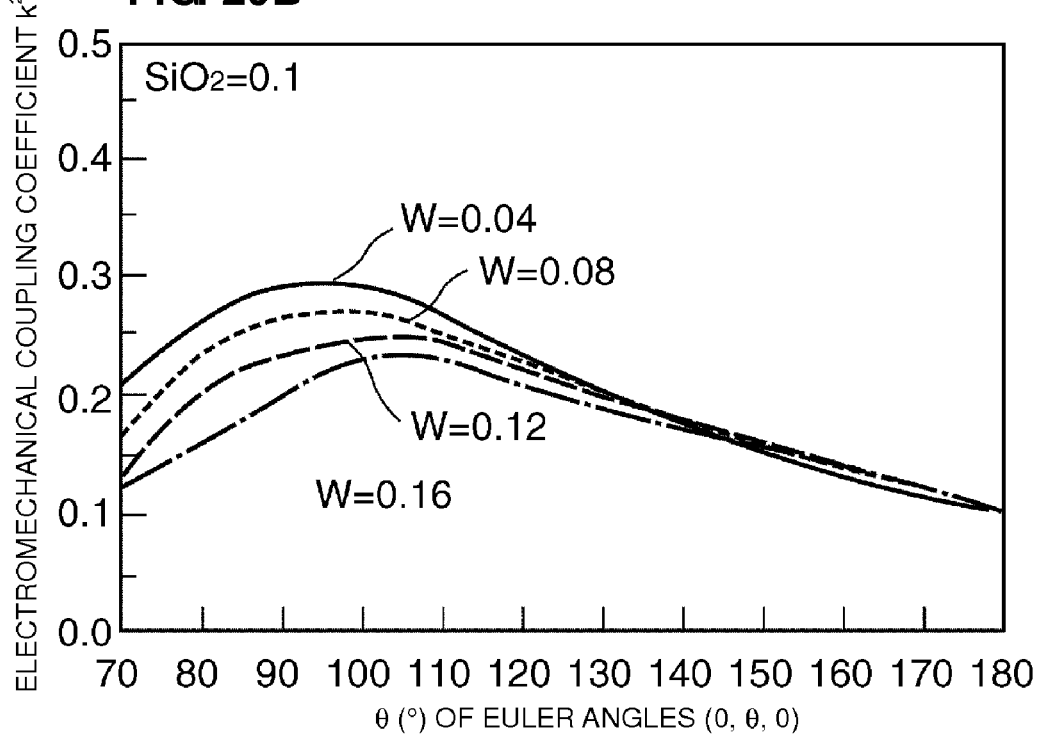
Figure 21A:
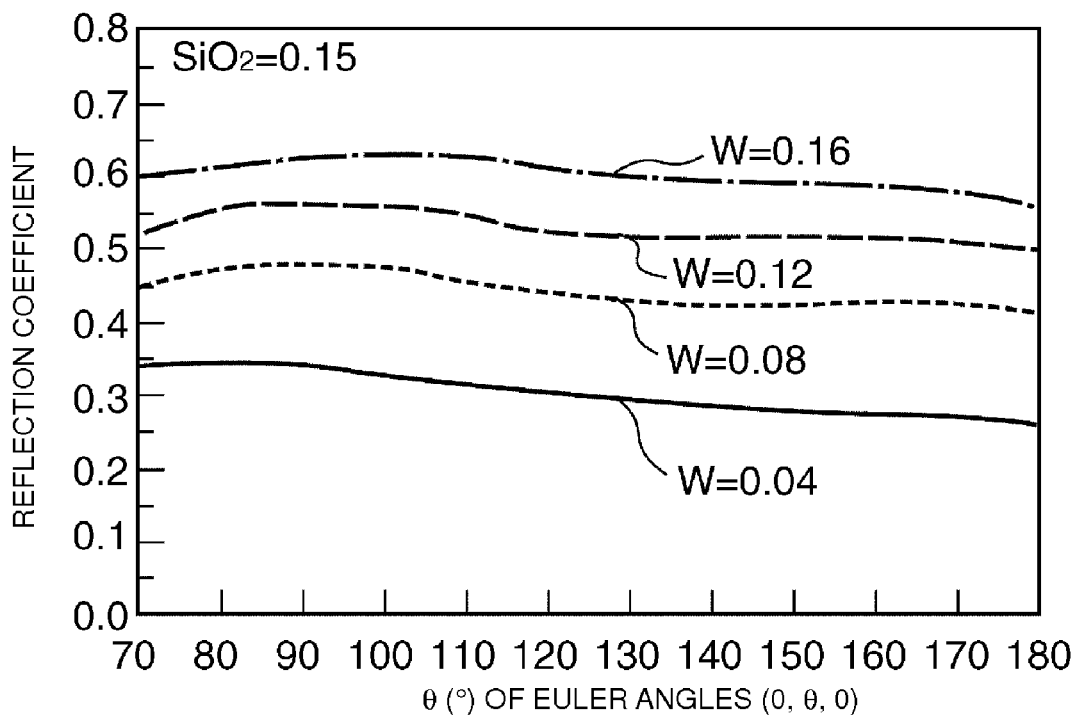
FIGS. 21A and 21B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.15.
Figure 21B:
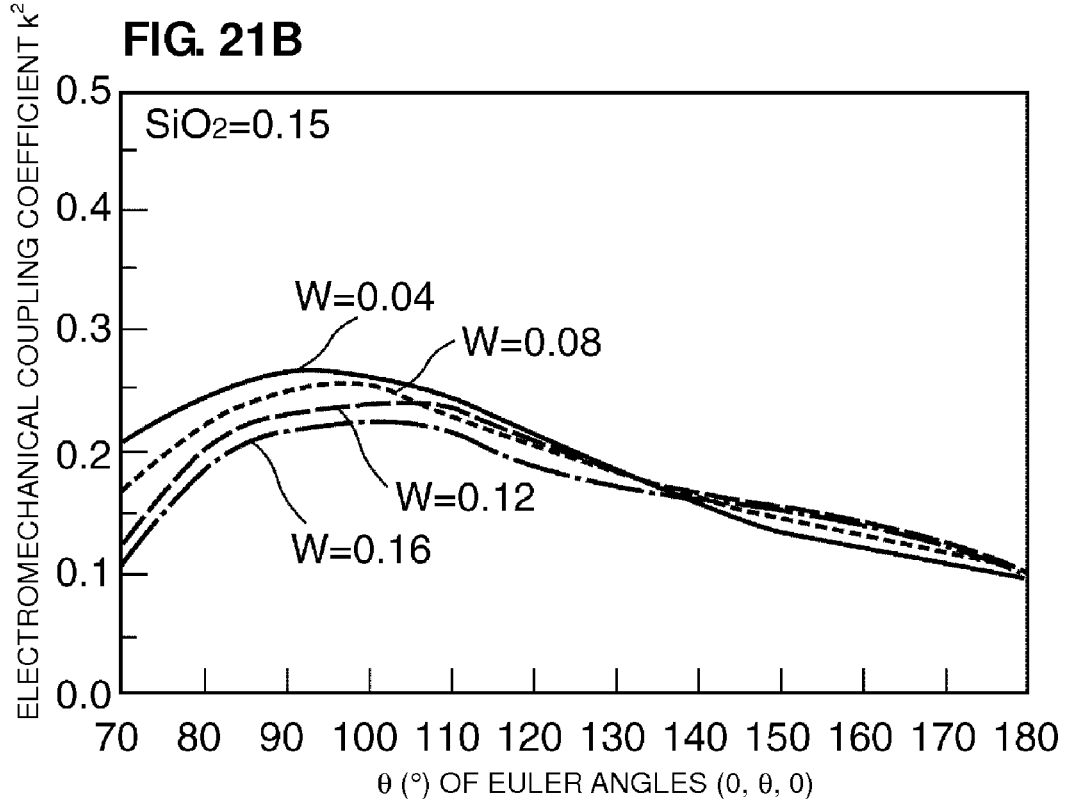
Figure 22A:
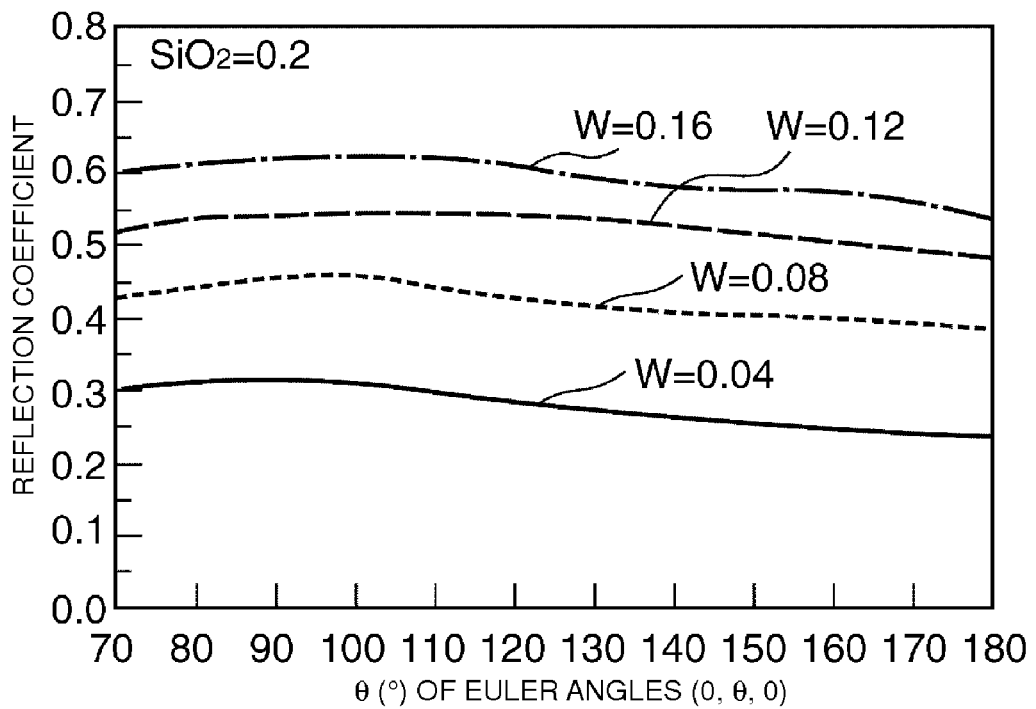
FIGS. 22A and 22B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.2.
Figure 22B:
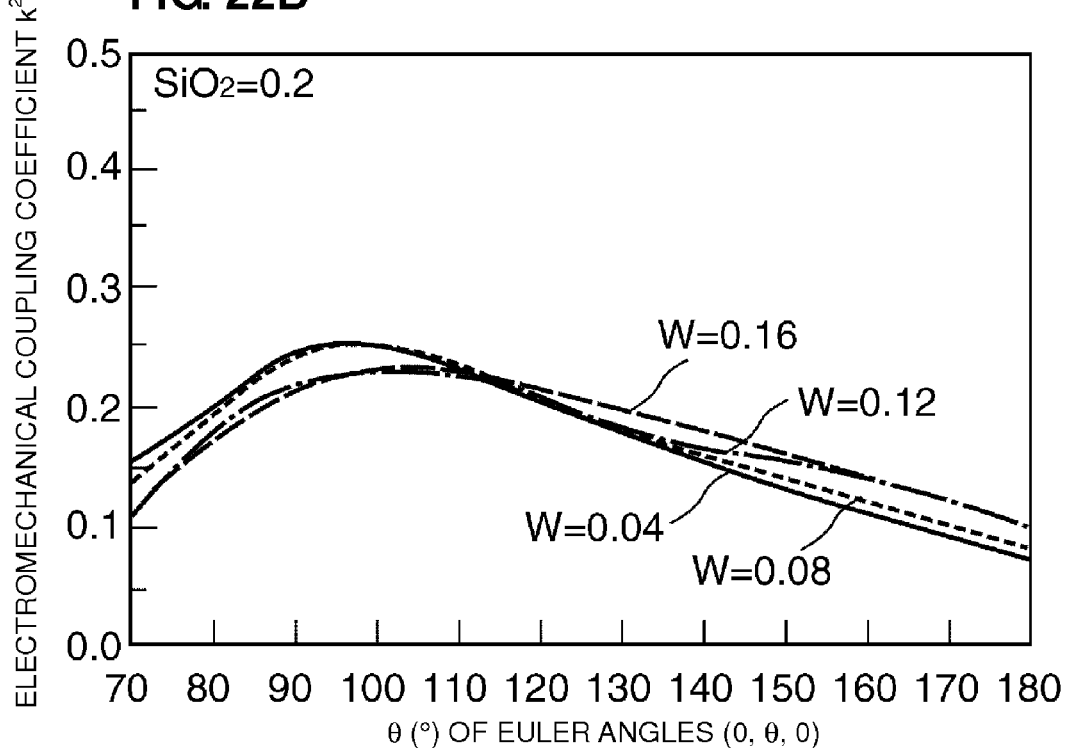
Figure 23A:
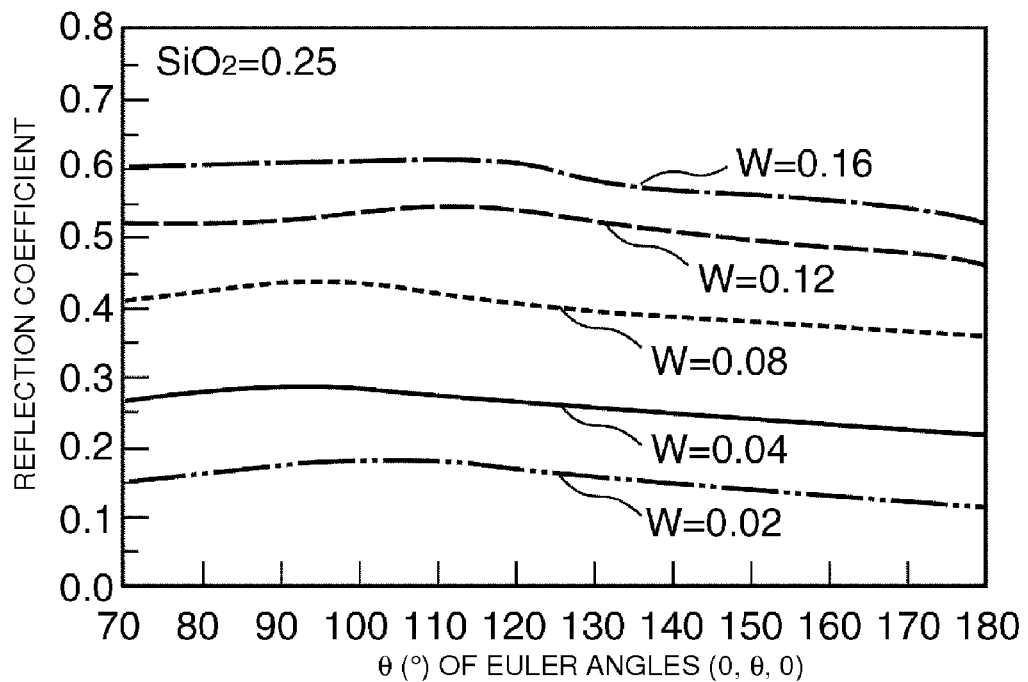
FIGS. 23A and 23B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.25.
Figure 23B:
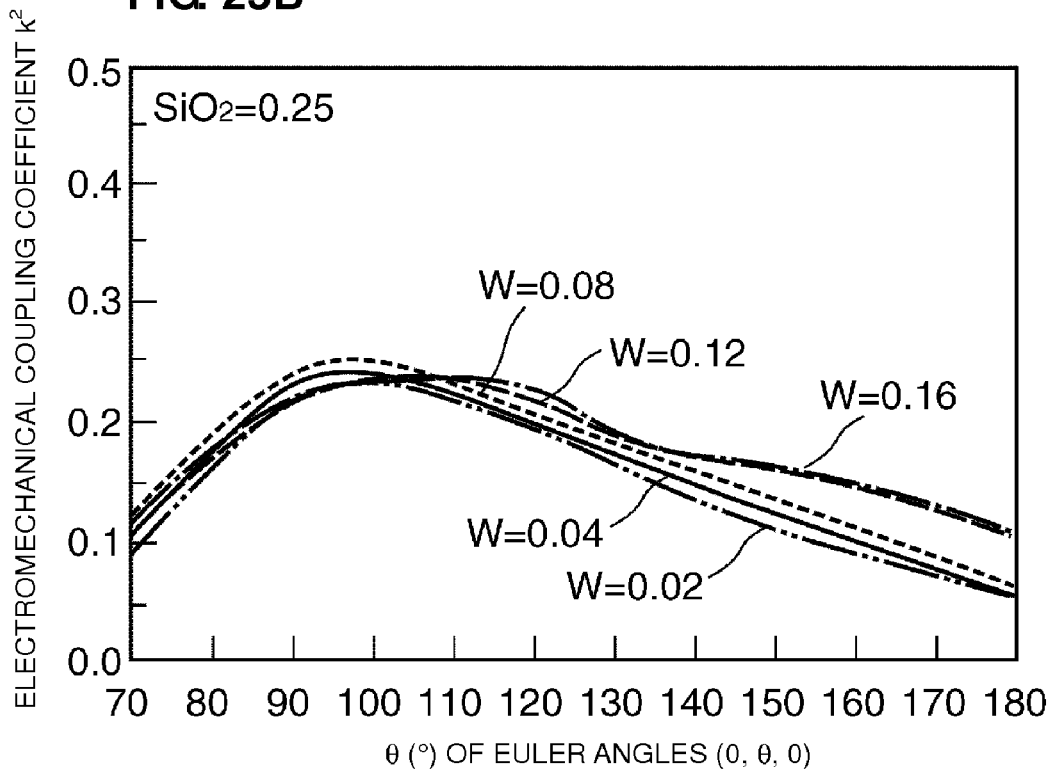
Figure 24A:
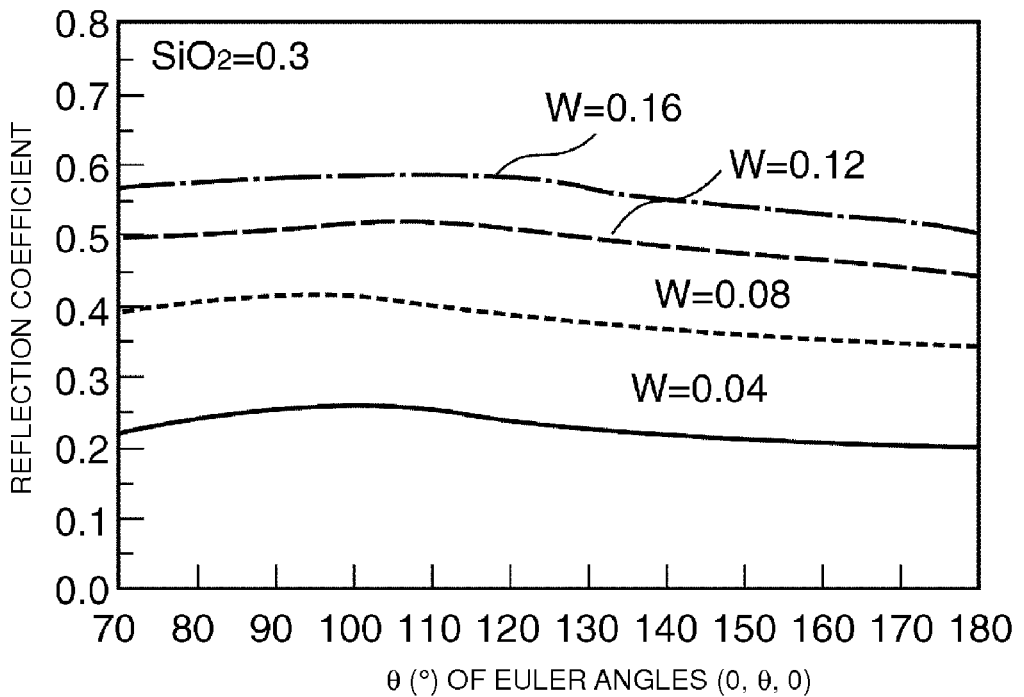
FIGS. 24A and 24B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.3.
Figure 24B:
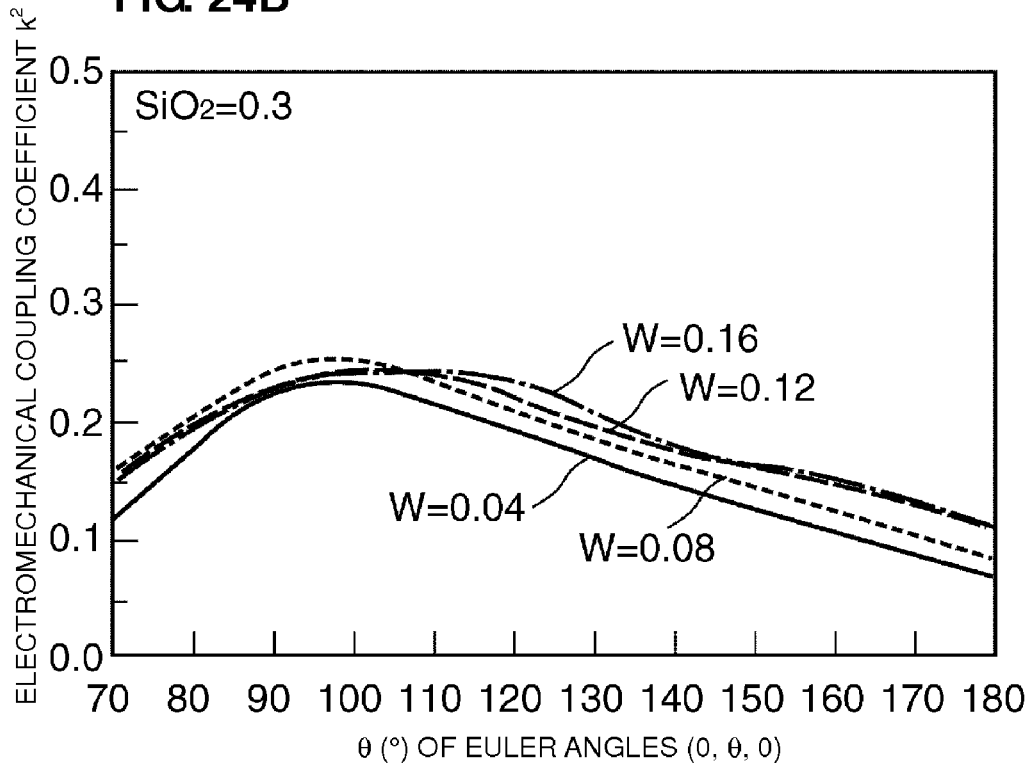
Figure 25A:
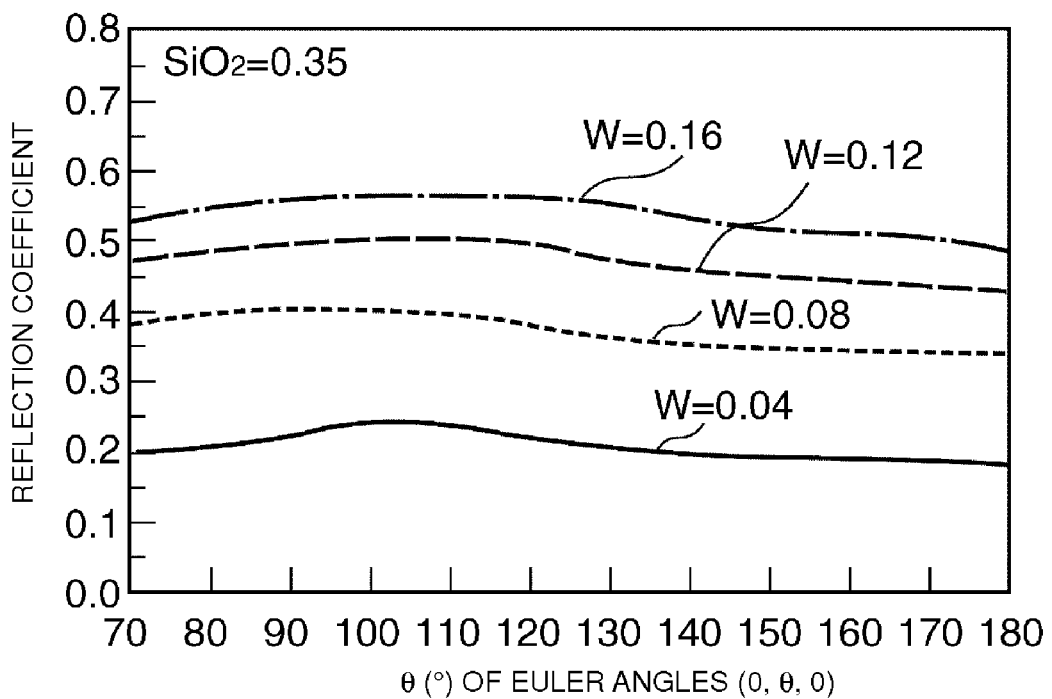
FIGS. 25A and 25B are views showing the relationship of the reflection coefficient with a normalized film thickness of a W film and the Euler angle θ and the relationship of the electromechanical coupling coefficient $K^2$ therewith, respectively, according to a preferred embodiment of the present invention, each of which is obtained when W is used as a metal material for an IDT and a normalized film thickness of an $SiO_2$ film is about 0.35.
Figure 25B:
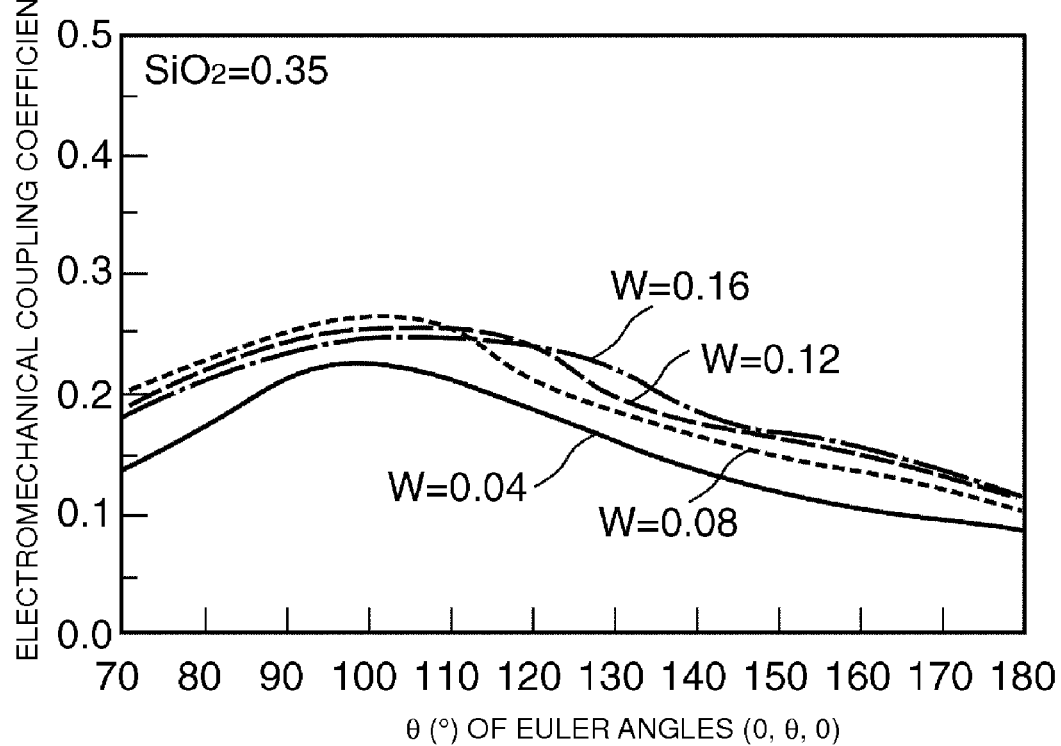
Figure 26:
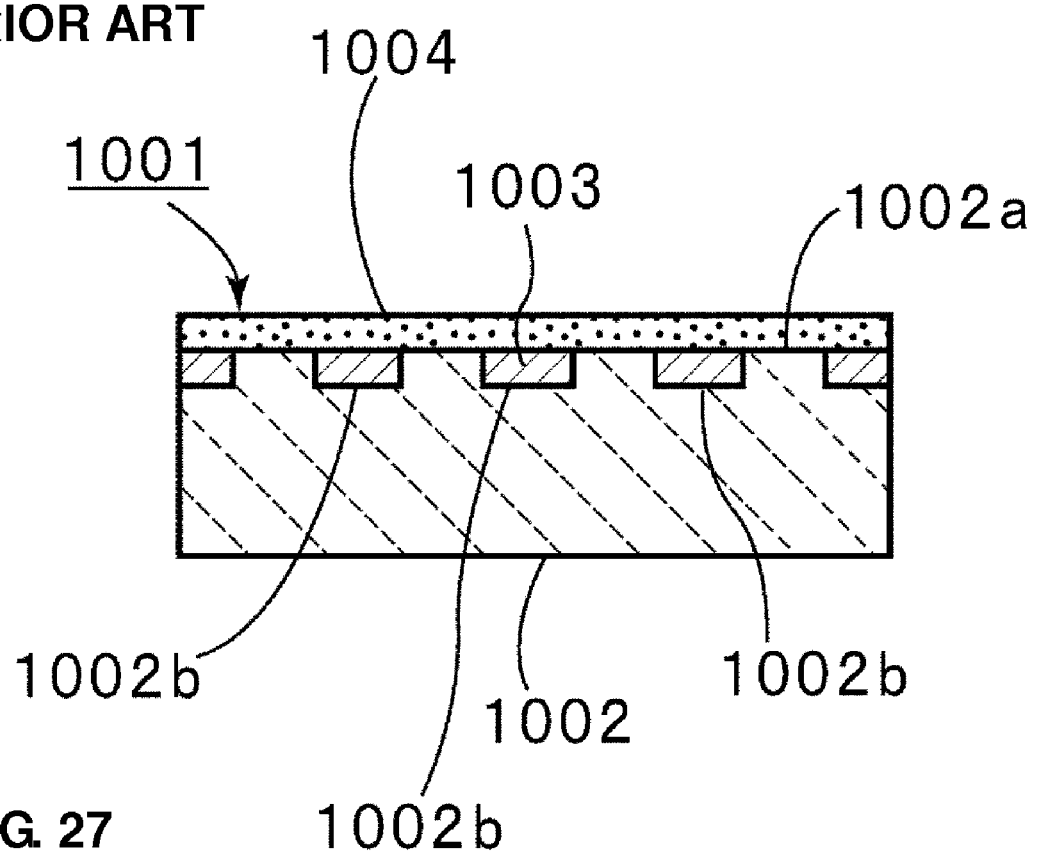
FIG. 26 is a schematic front cross-sectional view illustrating one example of a related surface acoustic wave device.
Figure 27:
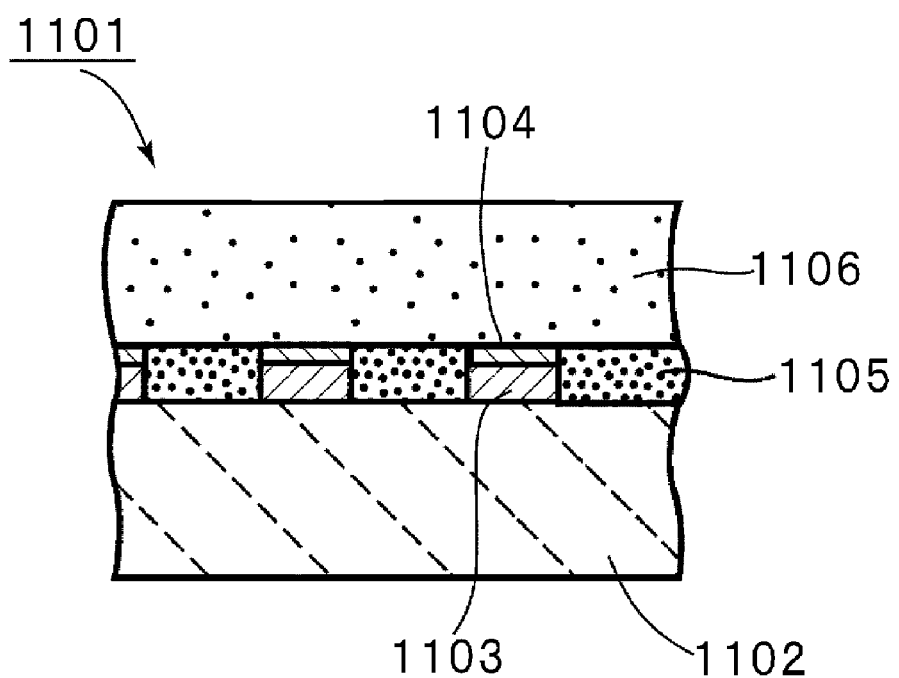
FIG. 27 is a partially cut-away front cross-sectional view illustrating another example of a related surface acoustic wave device.

In addition, FIGS. 18A and 18B show the results obtained when the normalized film thickness of the $SiO_2$ film normalized by λ is 0, that is, when no $SiO_2$ film is provided, and FIGS. 19A to 25B show the results obtained when the normalized film thickness of the $SiO_2$ film is about 0.05, about 0.1, about 0.15, about 0.2, about 0.25, about 0.3, or about 0.35. In addition, the film of W used as the metal material for the IDT 3 and the reflectors 5 and 6 is configured to have various normalized film thicknesses as shown in FIGS. 18A to 25B. As shown in FIG. 4 described above, when W is used as the metal material, compared to the case in which Al is used, a high reflection coefficient can be obtained regardless of the range of the Euler angle θ. In FIG. 18A to FIG. 25A, it was also discovered that even when the film thickness of the W film is variously changed, a high reflection coefficient can be obtained regardless of the value of the Euler angle θ.

On the other hand, as shown in FIG. 18B to FIG. 25B, it was discovered that when the normalized film thickness of W is in the range of about 0.04 to about 0.08, if the range of the normalized film thickness of the $SiO_2$ film and the range of the Euler angle θ correspond to one of combinations shown in Table 12 below, the electromechanical coupling coefficient $K^2$ is about 0.2 or greater. In addition, in Table 12, the lower limit and the upper limit of the range of the Euler angle θ are shown. For example, Table 12 indicates that when the film thickness of the $SiO_2$ film is about 0.05 or less, the Euler angle θ may be set in the range of about 75° to about 133°.

In addition, when the film thickness of the W film is in the range of about 0.08 to about 0.12, the range of the film thickness of the $SiO_2$ film and the range of the Euler angle θ may correspond to one of combinations shown in Table 13 below, and when the normalized film thickness of the W film is in the range of about 0.12 to about 0.16, the range of the film thickness of the $SiO_2$ film and the range of the Euler angle θ may correspond to one of combinations shown in Table 14 below, so that the electromechanical coupling coefficient $K^2$ is about 0.2 or greater as in the case described above. Tables 12 to 14 are based on the results shown in FIGS. 18A to 25B described above.

TABLE 12

| | RANGE OF EULER ANGLE TO SATISFY $0.2 \geq K^2$ | |
|---|---|---|
| 4 ≦ FILM THICKNESS OF W ≦ 8 | LOWER LIMIT OF EULER ANGLE θ | UPPER LIMIT OF EULER ANGLE θ |
| 0 ≦ FILM THICKNESS OF $SiO_2$ ≦ 5 | 75 | 133 |
| 5 < FILM THICKNESS OF $SiO_2$ ≦ 10 | 75 | 131 |
| 10 < FILM THICKNESS OF $SiO_2$ ≦ 15 | 75 | 124 |
| 15 < FILM THICKNESS OF $SiO_2$ ≦ 20 | 82 | 123 |
| 20 < FILM THICKNESS OF $SiO_2$ ≦ 25 | 84 | 120 |
| 25 < FILM THICKNESS OF $SiO_2$ ≦ 30 | 86 | 116 |
| 30 < FILM THICKNESS OF $SiO_2$ ≦ 35 | 86 | 116 |

(The film thickness of W and the film thickness of $SiO_2$ in the table each indicate the value of the normalized film thickness × $10^2$.)

TABLE 13

| | RANGE OF EULER ANGLE TO SATISFY $0.2 \geq K^2$ | |
|---|---|---|
| 8 < FILM THICKNESS OF W ≦ 12 | LOWER LIMIT OF EULER ANGLE θ | UPPER LIMIT OF EULER ANGLE θ |
| 0 ≦ FILM THICKNESS OF $SiO_2$ ≦ 5 | 82 | 133 |
| 5 < FILM THICKNESS OF $SiO_2$ ≦ 10 | 82 | 131 |
| 10 < FILM THICKNESS OF $SiO_2$ ≦ 15 | 80 | 122 |
| 15 < FILM THICKNESS OF $SiO_2$ ≦ 20 | 86 | 122 |
| 20 < FILM THICKNESS OF $SiO_2$ ≦ 25 | 87 | 123 |
| 25 < FILM THICKNESS OF $SiO_2$ ≦ 30 | 87 | 122 |
| 30 < FILM THICKNESS OF $SiO_2$ ≦ 35 | 86 | 116 |

(The film thickness of W and the film thickness of $SiO_2$ in the table each indicate the value of the normalized film thickness × $10^2$.)

TABLE 14

| | RANGE OF EULER ANGLE TO SATISFY $0.2 \geq K^2$ | |
|---|---|---|
| 12 < FILM THICKNESS OF W ≦ 16 | LOWER LIMIT OF EULER ANGLE θ | UPPER LIMIT OF EULER ANGLE θ |
| 0 ≦ FILM THICKNESS OF $SiO_2$ ≦ 5 | 91 | 128 |
| 5 < FILM THICKNESS OF $SiO_2$ ≦ 10 | 93 | 123 |
| 10 < FILM THICKNESS OF $SiO_2$ ≦ 15 | 93 | 117 |
| 15 < FILM THICKNESS OF $SiO_2$ ≦ 20 | 85 | 117 |
| 20 < FILM THICKNESS OF $SiO_2$ ≦ 25 | 88 | 124 |

TABLE 14-continued

| | RANGE OF EULER ANGLE TO SATISFY $0.2 \geq K^2$ | |
|---|---|---|
| 12 < FILM THICKNESS OF W ≦ 16 | LOWER LIMIT OF EULER ANGLE θ | UPPER LIMIT OF EULER ANGLE θ |
| 25 < FILM THICKNESS OF $SiO_2$ ≦ 30 | 88 | 126 |
| 30 < FILM THICKNESS OF $SiO_2$ ≦ 35 | 82 | 128 |

(The film thickness of W and the film thickness of $SiO_2$ in the table each indicate the value of the normalized film thickness × $10^2$.)

As described above, when the IDT electrode is formed, the metal material is filled in the grooves provided in the upper surface of the $LiNbO_3$ substrate. In this case, in addition to the metals described above, the metal material may be an alloy primarily including at least one of Pt or W.

In addition, in the above-described experimental examples, although the $SiO_2$ film was preferably provided, instead of the $SiO_2$ film, a dielectric film made of an inorganic material primarily including an $SiO_2$ film, for example, may also be used. In both cases, since having a positive temperature coefficient of frequency, when the dielectric films described above are each used in combination with an $LiNbO_3$ substrate having a negative temperature coefficient of frequency, the absolute value of the temperature coefficient of frequency of the surface acoustic wave device can be decreased. That is, a surface acoustic wave device having superior temperature characteristics can be provided.

In addition, the electrode structure of the surface acoustic wave device formed according to preferred embodiments of the present invention is not limited to that shown in FIG. 1, and preferred embodiments of the present invention may be applied, for example, to surface acoustic wave resonators and surface acoustic wave filters which have various electrode structures.

In addition, according to preferred embodiments of the present invention, it has been shown as described above that the Euler angles (φ, θ, ψ) of $LiNbO_3$ are not particularly limited. However, when a Rayleigh wave or an SH wave is utilized as a surface acoustic wave, the Euler angle φ is preferably in the range of about 0°±10°, the Euler angle θ is preferably in the range of about 70° to about 180°, and the Euler angle ψ is preferably in the range of about 0°±10°, for example. That is, when the Euler angles are set in the range of (0°±10°, 70° to 180°, 0°±10°), the Rayleigh wave and the SH wave can be preferably utilized. More particular, in the range of (0°±10°, 90° to 180°, 0°±10°), the SH wave can be more preferably utilized.

In addition, an LSAW wave may also be utilized, and in this case, the Euler angles may preferably be set in the range of (0°±10°, 110° to 160°, 0°±10°. In addition, in the preferred embodiments of the present invention, although the electrode structure of a one-port type SAW resonator is shown, the surface acoustic wave device of preferred embodiments of the present invention can be widely applied to other resonator structures or other resonator type surface acoustic wave filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
    a piezoelectric substrate including a plurality of grooves provided in an upper surface thereof and being made of an $LiNbO_3$ substrate; and an IDT including a plurality of electrode fingers made of a metal material which is filled in the plurality of grooves in the upper surface of the piezoelectric substrate; wherein the metal material is Pt or W or an alloy primarily including at least one of Pt or W; and when a wavelength of a surface acoustic wave is represented by λ, an electrode thickness of the IDT and θ of Euler angles (0°±10°, θ, 0°±10°) of the $LiNbO_3$ substrate are one of combinations shown in Table 1:

TABLE 1

| ELECTRODE MATERIAL | ELECTRODE THICKNESS | EULER ANGLE θ |
|---|---|---|
| Pt | 0.04λ ≦ Pt ≦ 0.08λ | 70° ≦ θ ≦ 134° |
| W | 0.02λ ≦ W ≦ 0.04λ | 70° ≦ θ ≦ 139° |
| W | 0.04λ < W ≦ 0.08λ | 74° ≦ θ ≦ 139°. |

2. The surface acoustic wave device according to claim 1, further comprising a dielectric film made of $SiO_2$ or an inorganic material primarily including $SiO_2$ and arranged to cover the IDT and the piezoelectric substrate.

3. A surface acoustic wave device comprising:

a piezoelectric substrate including a plurality of grooves provided in an upper surface thereof and being made of an $LiNbO_3$ substrate;

an IDT including a plurality of electrode fingers made of a metal material which is filled in the plurality of grooves in the upper surface of the piezoelectric substrate; and a dielectric film made of $SiO_2$ or an inorganic material primarily including $SiO_2$ and arranged to cover the IDT and the piezoelectric substrate; wherein the metal material is Pt or W or an alloy primarily including at least one of Pt or W; and when a wavelength of a surface acoustic wave is represented by λ, a normalized film thickness of the IDT normalized by λ, a normalized film thickness of an $SiO_2$ film used as the dielectric film normalized by λ, and θ of Euler angles (0°±10°, θ, 0°±10°) of the $LiNbO_3$ substrate are one of combinations shown in Tables 2 to 7:

TABLE 2

| | RANGE OF EULER ANGLE TO SATISFY 0.2 ≧ $K^2$ | |
|---|---|---|
| 4 ≦ FILM THICKNESS OF Pt ≦ 8 | LOWER LIMIT OF EULER ANGLE θ | UPPER LIMIT OF EULER ANGLE θ |
| 0 ≦ FILM THICKNESS OF $SiO_2$ ≦ 5 | 71 | 131 |
| 5 < FILM THICKNESS OF $SiO_2$ ≦ 10 | 71 | 121 |
| 10 < FILM THICKNESS OF $SiO_2$ ≦ 15 | 71 | 117 |
| 15 < FILM THICKNESS OF $SiO_2$ ≦ 20 | 71 | 117 |
| 20 < FILM THICKNESS OF $SiO_2$ ≦ 25 | 78 | 120 |
| 25 < FILM THICKNESS OF $SiO_2$ ≦ 30 | 78 | 120 |
| 30 < FILM THICKNESS OF $SiO_2$ ≦ 35 | 74 | 116 |

(the film thickness of Pt and the film thickness of $SiO_2$ in the table each indicate the value of the normalized film thickness × $10^2$)

TABLE 3

| | RANGE OF EULER ANGLE TO SATISFY 0.2 ≧ $K^2$ | |
|---|---|---|
| 8 < FILM THICKNESS OF Pt ≦ 12 | LOWER LIMIT OF EULER ANGLE θ | UPPER LIMIT OF EULER ANGLE θ |
| 0 ≦ FILM THICKNESS OF $SiO_2$ ≦ 5 | 76 | 131 |
| 5 < FILM THICKNESS OF $SiO_2$ ≦ 10 | 77 | 121 |
| 10 < FILM THICKNESS OF $SiO_2$ ≦ 15 | 79 | 117 |
| 15 < FILM THICKNESS OF $SiO_2$ ≦ 20 | 79 | 117 |
| 20 < FILM THICKNESS OF $SiO_2$ ≦ 25 | 79 | 123 |
| 25 < FILM THICKNESS OF $SiO_2$ ≦ 30 | 78 | 128 |
| 30 < FILM THICKNESS OF $SiO_2$ ≦ 35 | 77 | 116 |

(the film thickness of Pt and the film thickness of $SiO_2$ in the table each indicate the value of the normalized film thickness × $10^2$)

TABLE 4

| | RANGE OF EULER ANGLE TO SATISFY 0.2 ≧ $K^2$ | |
|---|---|---|
| 12 < FILM THICKNESS OF Pt ≦ 16 | LOWER LIMIT OF EULER ANGLE θ | UPPER LIMIT OF EULER ANGLE θ |
| 0 ≦ FILM THICKNESS OF $SiO_2$ ≦ 5 | 81 | 125 |
| 5 < FILM THICKNESS OF $SiO_2$ ≦ 10 | 85 | 121 |
| 10 < FILM THICKNESS OF $SiO_2$ ≦ 15 | 88 | 119 |
| 15 < FILM THICKNESS OF $SiO_2$ ≦ 20 | 88 | 119 |
| 20 < FILM THICKNESS OF $SiO_2$ ≦ 25 | 87 | 121 |
| 25 < FILM THICKNESS OF $SiO_2$ ≦ 30 | 83 | 126 |
| 30 < FILM THICKNESS OF $SiO_2$ ≦ 35 | 78 | 132 |

(the film thickness of Pt and the film thickness of $SiO_2$ in the table each indicate the value of the normalized film thickness × $10^2$)

TABLE 5

| | RANGE OF EULER ANGLE TO SATISFY 0.2 ≧ $K^2$ | |
|---|---|---|
| 4 ≦ FILM THICKNESS OF W ≦ 8 | LOWER LIMIT OF EULER ANGLE θ | UPPER LIMIT OF EULER ANGLE θ |
| 0 ≦ FILM THICKNESS OF $SiO_2$ ≦ 5 | 75 | 133 |
| 5 < FILM THICKNESS OF $SiO_2$ ≦ 10 | 75 | 131 |
| 10 < FILM THICKNESS OF $SiO_2$ ≦ 15 | 75 | 124 |
| 15 < FILM THICKNESS OF $SiO_2$ ≦ 20 | 82 | 123 |
| 20 < FILM THICKNESS OF $SiO_2$ ≦ 25 | 84 | 120 |
| 25 < FILM THICKNESS OF $SiO_2$ ≦ 30 | 86 | 116 |
| 30 < FILM THICKNESS OF $SiO_2$ ≦ 35 | 86 | 116 |

(the film thickness of W and the film thickness of $SiO_2$ in the table each indicate the value of the normalized film thickness × $10^2$)

TABLE 6

| | RANGE OF EULER ANGLE TO SATISFY 0.2 ≧ $K^2$ | |
|---|---|---|
| 8 < FILM THICKNESS OF W ≦ 12 | LOWER LIMIT OF EULER ANGLE θ | UPPER LIMIT OF EULER ANGLE θ |
| 0 ≦ FILM THICKNESS OF $SiO_2$ ≦ 5 | 82 | 133 |
| 5 < FILM THICKNESS OF $SiO_2$ ≦ 10 | 82 | 131 |

TABLE 6-continued

| 8 < FILM THICKNESS OF W ≦ 12 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 10 < FILM THICKNESS OF $SiO_2$ ≦ 15 | 80 | 122 |
| 15 < FILM THICKNESS OF $SiO_2$ ≦ 20 | 86 | 122 |
| 20 < FILM THICKNESS OF $SiO_2$ ≦ 25 | 87 | 123 |
| 25 < FILM THICKNESS OF $SiO_2$ ≦ 30 | 87 | 122 |
| 30 < FILM THICKNESS OF $SiO_2$ ≦ 35 | 86 | 116 |

(the film thickness of W and the film thickness of $SiO_2$ in the table each indicate the value of the normalized film thickness × $10^2$)

TABLE 7

| 12 < FILM THICKNESS OF W ≦ 16 | RANGE OF EULER ANGLE TO SATISFY $0.2 \geq K^2$ | |
|---|---|---|
| | LOWER LIMIT OF EULER ANGLE θ | UPPER LIMIT OF EULER ANGLE θ |
| 0 ≦ FILM THICKNESS OF $SiO_2$ ≦ 5 | 91 | 128 |
| 5 < FILM THICKNESS OF $SiO_2$ ≦ 10 | 93 | 123 |
| 10 < FILM THICKNESS OF $SiO_2$ ≦ 15 | 93 | 117 |
| 15 < FILM THICKNESS OF $SiO_2$ ≦ 20 | 85 | 117 |
| 20 < FILM THICKNESS OF $SiO_2$ ≦ 25 | 88 | 124 |
| 25 < FILM THICKNESS OF $SiO_2$ ≦ 30 | 88 | 126 |
| 30 < FILM THICKNESS OF $SiO_2$ ≦ 35 | 82 | 128 |

(the film thickness of W and the film thickness of $SiO_2$ in the table each indicate the value of the normalized film thickness × $10^2$).

* * * * *